United States Patent
Miyata

(10) Patent No.: US 7,456,049 B2
(45) Date of Patent: Nov. 25, 2008

(54) METHOD OF FABRICATING LEAD FRAME AND METHOD OF FABRICATING SEMICONDUCTOR DEVICE USING THE SAME, AND LEAD FRAME AND SEMICONDUCTOR DEVICE USING THE SAME

(75) Inventor: Osamu Miyata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 246 days.

(21) Appl. No.: 11/324,330

(22) Filed: Jan. 4, 2006

(65) Prior Publication Data

US 2006/0110857 A1 May 25, 2006

Related U.S. Application Data

(62) Division of application No. 10/988,551, filed on Nov. 16, 2004, now Pat. No. 7,224,049.

(30) Foreign Application Priority Data

Nov. 19, 2003 (JP) ............... 2003-389770
Nov. 19, 2003 (JP) ............... 2003-389771

(51) Int. Cl.
*H01L 21/00* (2006.01)
(52) U.S. Cl. ............ 438/112; 438/11; 438/108; 257/E23.126; 257/E23.116
(58) Field of Classification Search ........... 438/112, 438/106, 108, 111; 257/E23.126, E23.128, 257/E23.116, E23.117, E23.135, E23.118, 257/E23.119
See application file for complete search history.

(56) References Cited

U.S. PATENT DOCUMENTS

| 6,081,029 | A | 6/2000 | Yamaguchi |
| 6,239,484 | B1 | 5/2001 | Dore et al. |
| 6,455,348 | B1 | 9/2002 | Yamaguchi |
| 6,664,133 | B2 | 12/2003 | Abe et al. |
| 6,664,433 | B1 | 12/2003 | Senzaki et al. |
| 2002/0096790 | A1 | 7/2002 | Kasuya |
| 2003/0067058 | A1 | 4/2003 | Abe et al. |
| 2003/0071344 | A1 | 4/2003 | Matsuzawa et al. |
| 2005/0104174 | A1* | 5/2005 | Kishimoto ................. 257/678 |

FOREIGN PATENT DOCUMENTS

| JP | 60-217651 | 10/1985 |
| JP | 04-107936 | 4/1992 |

(Continued)

*Primary Examiner*—Walter L Lindsay, Jr.
(74) *Attorney, Agent, or Firm*—Rabin & Berdo, PC

(57) ABSTRACT

A method of fabricating a lead frame for a semiconductor device having a semiconductor chip resin-sealed therein. The lead frame includes a lead to be electrically connected to the semiconductor chip within sealing resin and to be sealed into the sealing resin such that at least a part of its mounting surface is exposed from the sealing resin. The method includes a lead forming step for forming the lead, and a side edge coining step for subjecting a side edge of a sealed surface, which is a surface on the opposite side of the mounting surface, of the lead to coining processing from the side of the sealed surface, to form a slipping preventing portion. The slipping preventing portion is to project sideward from the lead and to have a slipping preventing surface between the mounting surface and the sealed surface of the lead.

11 Claims, 14 Drawing Sheets

FOREIGN PATENT DOCUMENTS

| | | |
|---|---|---|
| JP | 11-260985 | 9/1999 |
| JP | 2000-068439 | 3/2000 |
| JP | 2002-134677 | 5/2002 |
| JP | 2003-188332 | 7/2003 |
| JP | 2003-318345 | 11/2003 |

* cited by examiner

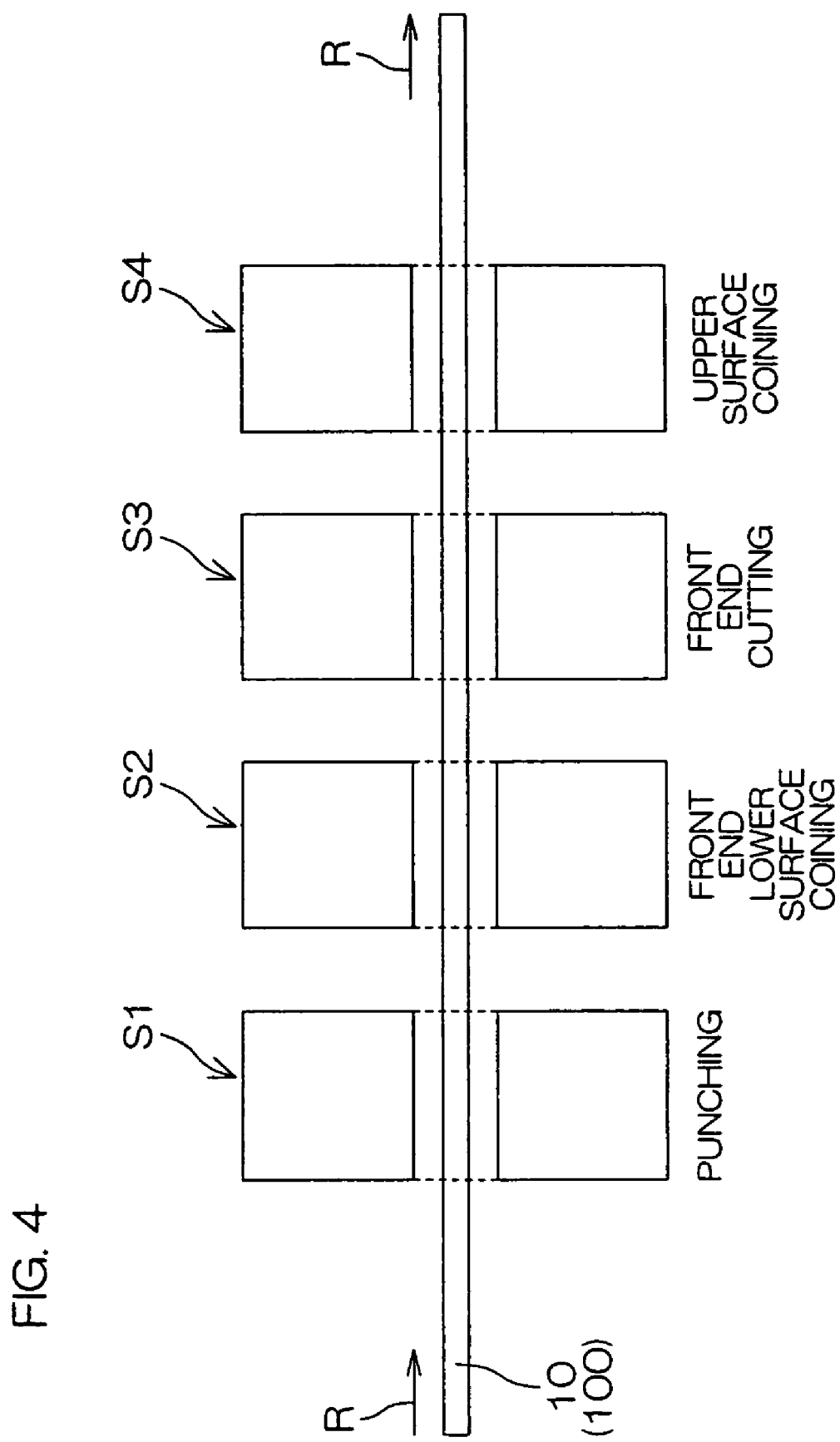

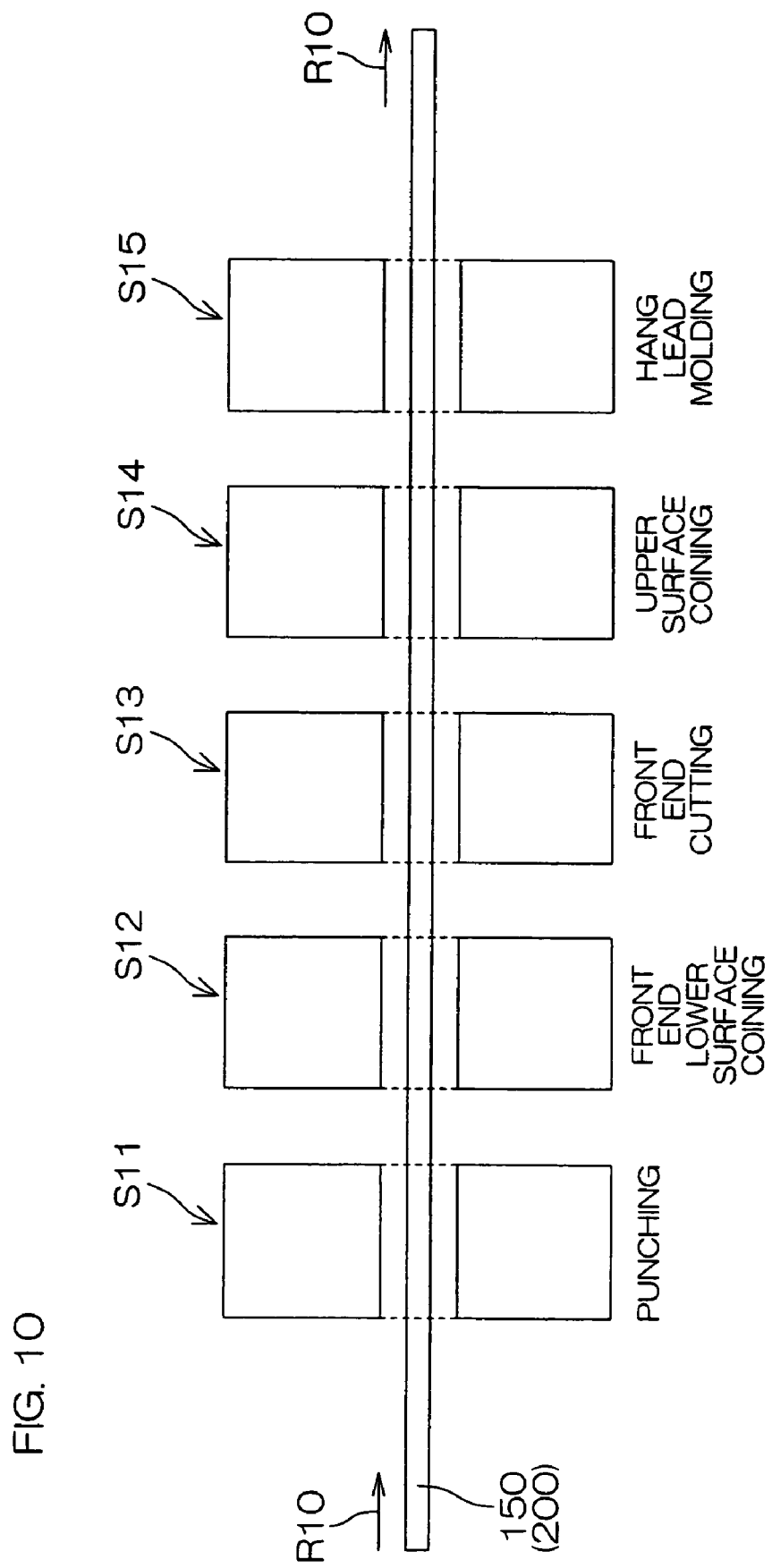

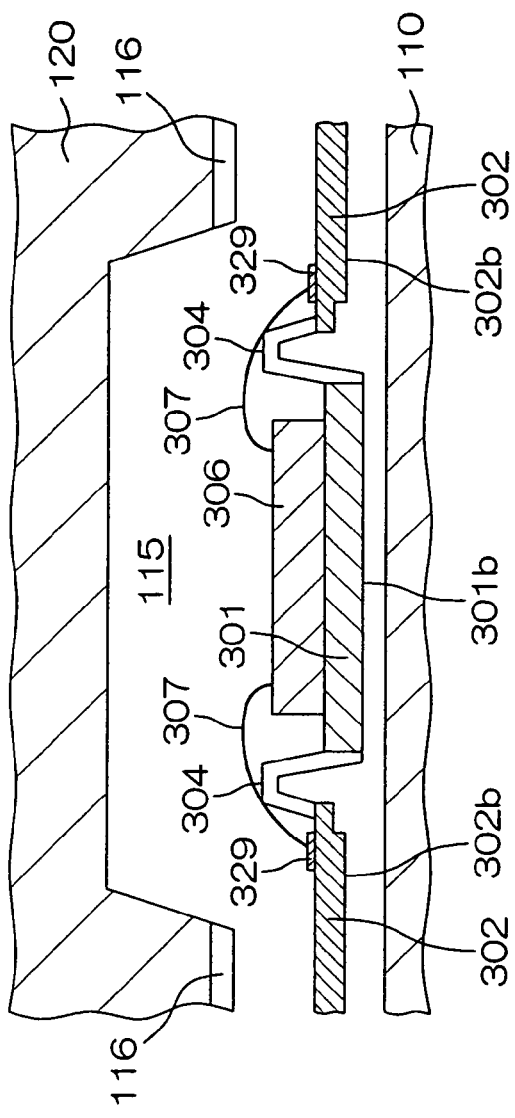
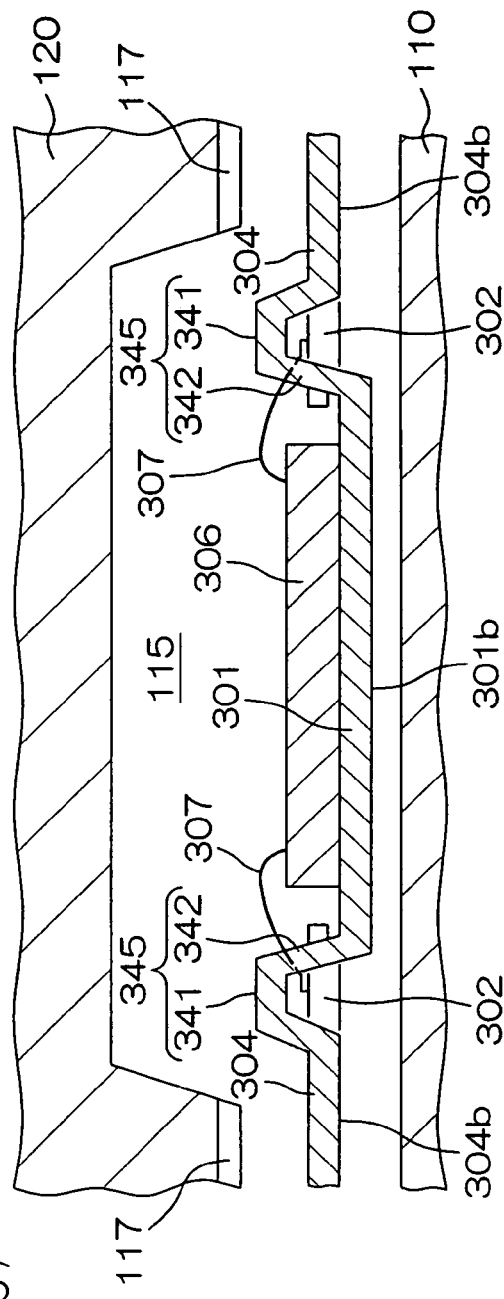
FIG. 13(a)
FIG. 13(b)

METHOD OF FABRICATING LEAD FRAME AND METHOD OF FABRICATING SEMICONDUCTOR DEVICE USING THE SAME, AND LEAD FRAME AND SEMICONDUCTOR DEVICE USING THE SAME

This is a Divisional of U.S. application Ser. No.: 10/988,551, filed Nov. 16, 2004 now U.S. Pat. No. 7,224,049, the subject matter of which is incorporated herein by reference.

BACKGROUND OF THE INVENTION

1. Field of the Invention

The present invention relates to a method of fabricating a lead frame for a semiconductor device fabricated by resin-sealing a semiconductor chip and a method of fabricating a semiconductor device using the same, and such a lead frame and a semiconductor device using the same.

2. Description of Related Art

In order to high-density mount a semiconductor device on a wiring substrate, a package for high-density mounting allowing surface-mounting on the wiring substrate by eliminating extension of a lead from a molding resin package and exposing a lead (a terminal portion electrically connected to a semiconductor chip) of a lead frame to a lower surface of the package has been conventionally used. Known as such a package for high-density mounting have been leadless packages such as QFN (Quad Flat Non-leaded Package) or SON (Small Outlined Non-leaded Package).

In the packages in these forms, a lower surface of the lead sealed with molding resin, together with the semiconductor chip, is exposed to the lower surface of the package, so that the lead easily slips off the molding resin. Therefore, the lead can be prevented from slipping off by forming the lead into a reverse tapered shape and forming a step on a side surface of the lead.

In order to form the lead having such a cross-sectional shape, the lead frame has been conventionally processed by etching. However, a long time is required for the processing. Therefore, the fabrication of the lead frame using a precision press metal mold has been recently proposed, as disclosed in U.S. Pat. No. 6,664,133.

In the method disclosed in the U.S. Patent, the lead frame is fabricated by subjecting a metal plate serving as a material for the lead frame to punching processing and pressing processing using a punch from the side of a lower surface of the lead frame, and stepped shapes for slipping prevention are respectively formed at a front end and on a side surface of the lead.

More specifically, in the method disclosed in the US patent, the center of the lead is made wide, and a side edge of the center is subjected to pressing processing using a punch from the side of a lower surface of the lead, thereby forming a two-step shape for slipping prevention. For the purpose of preventing a burr from occurring in the case of pressing processing from the side of the lower surface, a constricted part is formed on a side surface between the center and the base of the lead.

In the method disclosed in the US patent, the shape of the lower surface of the lead obtained by the punching processing is lost in performing the pressing processing from the side of the lower surface. Therefore, the lower surface of the lead for making electrical connection to the exterior may not have a desired shape (e.g., a linear shape).

In order to prevent the metal burr occurring in the case of frame processing, the constricted part must be formed between the center and the base of the lead, so that the shape of the lead first formed by the punching processing is complicated. Consequently, required as a metal mold (a punch) for the punching processing is one which is subjected to complicated processing.

In the prior art disclosed in the US patent, therefore, a lot of metal molds having a precise and complicated structure are required, so that the fabrication costs of the metal molds pile up. As a result, the fabrication cost of the lead frame and therefore, the fabrication cost of the semiconductor device rises.

On the other hand, in the above-mentioned semiconductor package, a package (e.g., HQFN: Heat Sinked Quad Flat Non-leaded Package) having a structure for exposing an island (a chip support having a semiconductor chip carried thereon) of a lead frame on a lower surface of the package has been put to practical use in order to enhance heat dissipating properties.

In the package having such a structure, a lower surface of the island, together with the semiconductor chip, sealed with molding resin is exposed to the lower surface of the package, so that the island easily slips off the molding resin. Therefore, an end surface of the island is made to have a reverse tapered shape, or the island is formed with a step to prevent the island from slipping off.

The island having such a cross-sectional shape has been formed by etching, as disclosed in US Patent Application Publication No. 2002/0096790A1, for example.

Since running cost is required to process the end surface of the island by etching, however, the lead frame cannot be fabricated at low cost.

In the prior art disclosed in the US Patent Application Publication, in order to expose both the lead and the island from the lower surface of the package, they have been arranged so as to be flush with each other before resin sealing. When the lead is interposed between upper and lower metal molds to supply molding resin to a cavity between the metal molds, a pressing force from the upper metal mold is not exerted on the island, so that the resin detours toward the lower surface of the island. Therefore, the lower surface of the island is insufficiently exposed, thereby not obtaining a desired cooling effect.

SUMMARY OF THE INVENTION

An object of the present invention is to provide a method of fabricating a lead frame capable of forming a slipping preventing structure of a lead at low cost, and a method of fabricating a semiconductor device using the same.

Another object of the present invention is to provide a lead frame capable of forming a slipping preventing structure of a lead at low cost, and a semiconductor device using the same.

Still another object of the present invention is to provide a method of fabricating a lead frame having a slipping preventing structure of a chip support at low cost, and a method of fabricating a semiconductor device allowing cost reduction by using the same.

Yet still another object of the present invention is to provide a lead frame which can be fabricated at low cost while having a slipping preventing structure of a chip support, and a semiconductor device allowing fabricating cost reduction by using the same.

A further object of the present invention is to provide a method of fabricating a lead frame capable of reliably exposing a lower surface of a chip support from sealing resin, and a method of fabricating a semiconductor device using the same.

A still further object of the present invention is to provide a lead frame capable of reliably exposing a lower surface of a chip support from sealing resin, and a semiconductor device using the same.

A method of fabricating a lead frame according to a first aspect of the present invention is a method of fabricating a lead frame for a semiconductor device having a semiconductor chip resin-sealed therein, the lead frame including a lead to be electrically connected to the semiconductor chip within sealing resin and to be sealed into the sealing resin such that at least a part of its mounting surface is exposed from the sealing resin. The method including a lead forming step for forming the lead, and a side edge coining step for subjecting a side edge of a sealed surface, which is a surface on the opposite side of the mounting surface, of the lead to coining processing from the side of the sealed surface, to form a slipping preventing portion projecting sideward from the lead and having a slipping preventing surface between the mounting surface and the sealed surface of the lead.

According to this method, the slipping preventing portion which sticks out sideward from the lead is formed by the coining processing from the side of the sealed surface of the lead. The slipping preventing portion has the slipping preventing surface at an intermediate position of the plate thickness of the lead (between the mounting surface and the sealed surface). Accordingly, the sealing resin detours toward the mounting surface of the slipping preventing surface at the time of resin sealing. Consequently, the lead can be prevented from slipping off the sealing resin.

Since the slipping preventing portion is formed by the coining processing from the side of the sealed surface of the lead. Accordingly, a sag on the side of the mounting surface of the lead can be reprocessed to be flat at the time of the coining processing. Consequently, it is possible to reduce the detour of the sealing resin toward the mounting surface of the lead. Further, the shape of a metal mold for the coining processing may be simpler than a metal mold for pressing processing of a lower surface in the prior art disclosed in U.S. Pat. No. 6,664,133. Therefore, it is possible to reduce the fabrication costs of the lead frame and the semiconductor device using the same.

Since the sealed surface of the lead is sealed into the resin, the side edge thereof need not finally have a liner shape. Accordingly, an area corresponding to an outer lead of the mounting surface of the lead (a portion exposed to the lower surface of the sealing resin to make external connection) is subjected to the coining processing, thereby making it possible to form the slipping preventing portion. Consequently, the lead need not be previously provided with a wide part in order to form the slipping preventing portion. Accordingly, the lead first formed by the punching processing or the like can be made to have a simple shape (a linear shape) having no substantial steps (steps as viewed from the top) on its side surface. From this point, therefore, it is also possible to reduce the fabrication cost as well as to form the slipping preventing portion without causing a burr.

It is preferable that the lead forming step includes a step of forming the lead in a longitudinal shape. In this case, it is preferable that the side edge coining step includes a step of forming the slipping preventing portions at a plurality of positions spaced apart from one another in the longitudinal direction of the lead. In this method, the lead is formed in the longitudinal shape, and the slipping preventing portions are formed at the plurality of positions spaced apart from one another in the longitudinal direction of the lead. This makes it possible to effectively prevent the lead from slipping off the sealing resin along the longitudinal direction.

When the lead forming step includes a step of forming the lead in a longitudinal shape, the side edge coining step may include a step of forming the slipping preventing portions at both side edges of the sealed surface of the lead. According to this method, the slipping preventing portions are formed at both the side edges of the lead in the longitudinal shape. Consequently, the lead can be more effectively prevented from slipping off.

It is preferable that the lead forming step includes a punching processing step for a metal plate which is a material for the lead frame. According to this method, the lead and the slipping preventing portions can be formed by a series of press workings. It is preferable that the punching processing is performed from the side of the mounting surface of the lead. Consequently, no burr occurs on the mounting surface of the lead.

A method of fabricating a semiconductor device according to a first aspect of the present invention includes: a step of fabricating the lead frame by the above-mentioned method; a step of electrically connecting the sealed surface of the lead and the semiconductor chip to each other; a step of resin-sealing the lead frame, together with the semiconductor chip, such that at least a part of the mounting surface of the lead is exposed; and a step of cutting away an unnecessary part of the lead frame. It is preferable that the resin sealing step includes a step of sealing the semiconductor chip and the lead frame with the sealing resin such that an end surface of the sealing resin crosses the slipping preventing portion.

A lead frame according to a first aspect of the present invention is a lead frame for a semiconductor device having a semiconductor chip resin-sealed therein. The lead frame includes a lead to be electrically connected to the semiconductor chip within sealing resin and to be sealed into the sealing resin such that at least a part of its mounting surface is exposed from the sealing resin, and a slipping preventing portion formed by coining processing from the side of a sealed surface, which is a surface on the opposite side of the mounting surface, of the lead and projecting sideward from the lead. The lead frame is high in reliability and can be fabricated at low cost because the resin does not detour toward the mounting surface of the lead.

The lead may be formed in a longitudinal shape. In this case, it is preferable that the slipping preventing portions are formed at a plurality of positions spaced apart from one another in the longitudinal direction of the lead.

Furthermore, it is preferable that when the lead is formed in a longitudinal shape, the slipping preventing portions are formed at both side edges of the sealed surface of the lead.

A semiconductor device according to a first aspect of the present invention includes: the above-mentioned lead frame; the semiconductor chip electrically connected to the lead frame; and the sealing resin for sealing the semiconductor chip and the lead frame such that the mounting surface of the lead is exposed. The semiconductor device may further include a bump for electrically connecting the lead frame and the semiconductor chip to each other wirelessly. It is preferable that the sealing resin has its end surface formed so as to cross the slipping preventing portion.

A method of fabricating a lead frame according to a second aspect of the present invention is a method of fabricating a lead frame for a semiconductor device having a semiconductor chip resin-sealed therein, the lead frame including a chip support to have the semiconductor chip carried thereon and having one surface serving as an exposed surface exposed from the sealing resin and the other surface serving as a sealed surface sealed into the sealing resin. The method includes a step of shaping a metal plate to form the chip support, and a step of subjecting an edge of the chip support to coining processing from the side of the exposed surface or the sealed surface, and forming a slipping preventing portion sticking out sideward from the edge of the chip support at a position between the exposed surface and the sealed surface of the chip support.

According to this method, the slipping preventing portion is formed by subjecting the edge of the chip support to the coining processing from the side of the exposed surface or the sealed surface. Accordingly, the slipping preventing portion can be formed in steps at lower cost, as compared with that in a case where the slipping preventing portion is formed in an etching step. This allows the fabrication cost of the lead frame to be reduced.

The slipping preventing portion formed by the coining processing sticks out sideward from the edge of the chip support at an intermediate position of the plate thickness of the chip support (a position between the exposed surface and the sealed surface). Accordingly, the sealing resin detours toward the exposed surface at the time of resin sealing. This makes it possible to prevent the chip support from slipping off the sealing resin.

The coining processing for the edge of the chip support may be performed for the whole area at the edge or may be performed for a part of the edge.

It is preferable that the step of forming the chip support includes a punching step for punching a hole in the metal plate in the shape of the chip support from the exposed surface to the sealed surface of the chip support. According to this method, the chip support is formed by punching a hole in the metal plate which is a material for the lead frame from the side of the exposed surface. Consequently, the chip support and the slipping preventing portion can be formed using a press working apparatus. Therefore, the lead frame can be fabricated at low cost.

Furthermore, the chip support is formed by the punching processing from the side of the exposed surface, so that no burr projecting from the sealing resin occurs, thereby making it possible to bring the exposed surface into a flat surface and prevent the resin from adhering to the exposed surface of the chip support.

In order to more effectively prevent the resin from detouring toward the exposed surface of the chip support, it is preferable that almost the whole area at the edge of the chip support is subjected to coining processing from the side of the sealed surface (which may be a common process step to the coining processing for forming the slipping preventing portion). Consequently, the sag occurring at the edge of the exposed surface of the chip support can be reduced or eliminated by the punching processing from the side of the exposed surface, thereby making it possible to effectively restrain or prevent the detour of the sealing resin toward the exposed surface of the chip support.

It is preferable that the method further includes a step of forming a lead to be electrically connected to the semiconductor chip within sealing resin and to be sealed into the sealing resin such that at least a part of its mounting surface which is a surface on the same side of the exposed surface of the chip support is exposed from the sealing resin, a step of forming a hang lead for coupling the chip support to a frame for holding the lead, and a down-setting step for molding the hang lead and positioning the exposed surface of the chip support so as to project in the direction away from the lead on the same side of the mounting surface of the lead.

According to this method, the exposed surface of the chip support is positioned so as to project beyond the mounting surface of the lead. When the lead is resin-sealed in a state where the mounting surface of the lead and the exposed surface of the chip support are pressed against a flat surface of a metal mold, the hang lead is elastically deformed, to apply a pressing force against the metal mold to the chip support. This makes it possible to restrain and prevent the detour of the resin toward the exposed surface of the chip support, realizing a semiconductor device having good heat dissipation efficiency.

It is preferable that the hang lead is molded by press working. Consequently, the lead frame can be fabricated at low cost.

It is preferable that the hang lead is also formed by punching processing from the same side of the exposed surface.

A method of fabricating a lead frame according to a third aspect of the present invention is a method of fabricating a lead frame for a semiconductor device having a semiconductor chip resin-sealed therein, the lead frame including a chip support to have the semiconductor chip carried thereon and having one surface serving as an exposed surface exposed from the sealing resin and the other surface serving as a sealed surface sealed into the sealing resin, and a lead to be electrically connected to the semiconductor chip within the sealing resin and sealed into the sealing resin such that at least a part of its mounting surface which is a surface on the same side of the exposed surface is exposed from the sealing resin. The method includes a step of shaping a metal plate to form the lead, a step of shaping the metal plate to form the chip support, a step of forming a hang lead for coupling the chip support to a frame for holding the lead, and a down-setting step for molding the hang lead and positioning the exposed surface of the chip support so as to project in the direction away from the lead on the same side of the mounting surface of the lead.

It is preferable that the down-setting step includes a step of molding or forming the hang lead so as to have an up-set portion offset in the direction away from the lead on the opposite side of the mounting surface of the lead and a connecting portion for connecting the up-set portion and the chip support to each other. According to this method, the hang lead has a wavy shape. When the chip support is pressed against the flat surface of the metal mold, the hang lead is easily elastically deformed, thereby making it possible to restrain relative displacement (relative displacement as viewed from the top) between the chip support and the lead.

A method of fabricating a semiconductor device according to a second aspect of the present invention is a method of fabricating a semiconductor device, including: a step of fabricating the lead frame by the above-mentioned method; a step of carrying the semiconductor chip on the sealed surface of the chip support; and a step of resin-sealing the lead frame, together with the semiconductor chip, such that the exposed surface of the chip support is exposed.

It is preferable that the resin sealing step includes a step of sealing the lead and the chip support with the sealing resin in a state where the mounting surface of the lead and the exposed surface of the chip support in the lead frame are pressed against a flat surface of a metal mold. According to this method, the semiconductor device in a state where the mounting surface of the lead and the exposed surface of the chip support are exposed from the sealing resin is obtained.

A lead frame according to a second aspect of the present invention is a lead frame for a semiconductor device having a semiconductor chip resin-sealed therein, including a chip support to have the semiconductor chip carried thereon and having one surface serving as an exposed surface exposed from sealing resin and the other surface serving as a sealed surface to be sealed into the sealing resin, and a slipping preventing portion sticking out sideward from an edge of the chip support at an intermediate position in the thickness direction of the chip support and formed by subjecting the edge of the chip support to coining processing from the side of the exposed surface or the sealed surface.

It is preferable that the lead frame further includes a lead to be electrically connected to the semiconductor chip within the sealing resin and to be sealed into the sealing resin such that at least a part of its mounting surface which is a surface on the same side of the exposed surface is exposed from the sealing resin, and a hang lead formed so as to couple the chip support to a frame for holding the lead and to position the exposed surface of the chip support as projecting in the direction away from the lead on the same side of the mounting surface of the lead.

A lead frame according to a third aspect of the present invention is a lead frame for a semiconductor device having a semiconductor chip resin-sealed therein, including a chip support to have the semiconductor chip carried thereon and having one surface serving as an exposed surface exposed from the sealing resin and the other surface serving as a sealed surface to be sealed into the sealing resin, a lead to be electrically connected to the semiconductor chip within the sealing resin and to be sealed into the sealing resin such that at least a part of its mounting surface which is a surface on the same side of the exposed surface is exposed from the sealing resin, and a hang lead molded or formed so as to couple the chip support to a frame for holding the lead and to position the exposed surface of the chip support as projecting in the direction away from the lead on the same side of the mounting surface of the lead.

It is preferable that the mounting surface of the lead and a surface, on the same side of the mounting surface, of the frame are positioned so as to be substantially flush with each other.

It is preferable that the hang lead includes an up-set portion offset in the direction away from the lead on the opposite side of the mounting surface of the lead, and a connecting portion for connecting the up-set portion and the chip support to each other.

A semiconductor device according to a second aspect of the present invention is a semiconductor device comprising: the above-mentioned lead frame; the semiconductor chip carried on the sealed surface of the chip support in the lead frame; and the sealing resin for sealing the lead frame and the semiconductor chip such that the mounting surface of the lead and the exposed surface of the chip support in the lead frame are exposed with the surfaces being flush with each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a conceptual diagram for explaining the configuration of a precision press apparatus used for fabricating the lead frame;

FIG. 10 is a conceptual diagram for explaining the configuration of a precision press apparatus used for fabricating the lead frame;

FIGS. 13 (a) and 13 (b) are illustrative sectional views for explaining a resin sealing step;

DESCRIPTION OF THE PREFERRED EMBODIMENTS

Figure 1:
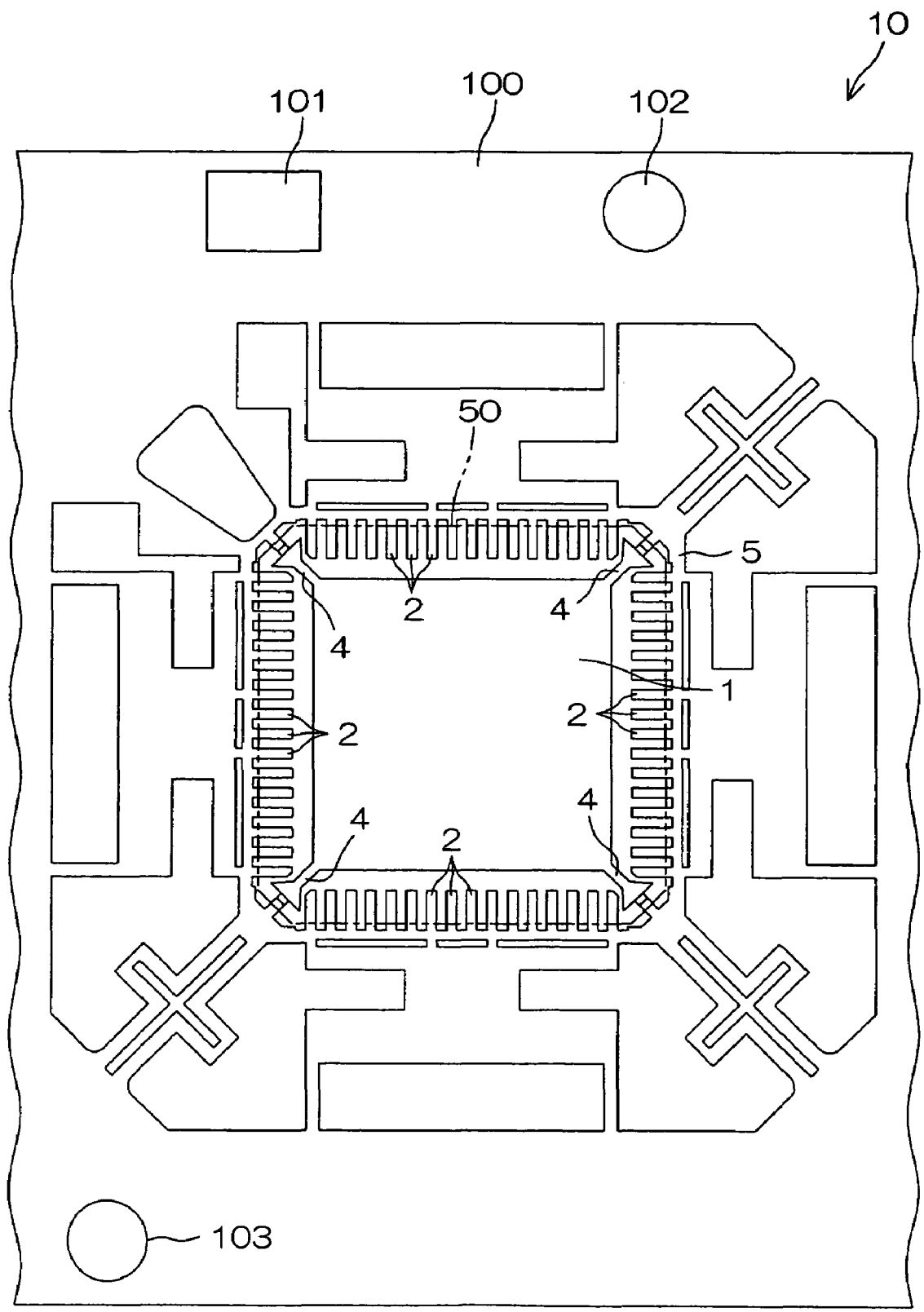
FIG. 1 is a plan view showing the configuration of a lead frame according to an embodiment of the present invention.

FIG. 1 is a plan view showing the configuration of a lead frame according to an embodiment of the present invention. FIG. 1 illustrates a unit portion corresponding to one semiconductor device. But in practice, unit portions corresponding to a plurality of semiconductor devices are connected to one another in a left-to-right direction in FIG. 1, thereby constituting a band-shaped chain member as a whole.

The lead frame 10 is fabricated by subjecting a metal plate (particularly a copper plate, for example, having a plate thickness of approximately 200 μm) 100 to precision press processing. A unit portion corresponding to one semiconductor device has a rectangular shape (an approximately square shape in an example of FIG. 1), and has a support (an island) 1 for supporting a semiconductor chip at its center and has a plurality of leads 2 arranged at approximately equal spacing so as to form an imaginary rectangular shape around its periphery.

The support 1 has a rectangular shape corresponding to the imaginary rectangular shape formed by the plurality of leads 2, and is coupled to a frame 5 connecting with the metal plate 100 through hang leads 4 at four corners of the rectangular shape in the present embodiment. Each of the leads 2 has a longitudinal shape arranged with its front end directed toward the support 1, and has its base end coupled to the frame 5. The plurality of leads 2 arranged along each of the sides of the imaginary rectangular shape are parallel to one another, and the longitudinal direction thereof is along a direction nearly perpendicular to the side. Reference numerals 101, 102, and 103 denote positioning holes for positioning the lead frame 10 in a processing step in each of press stations in a precision press apparatus, a mounting step for mounting the semiconductor chip, a sealing step for sealing with sealing resin, and so on.

Figure 2:
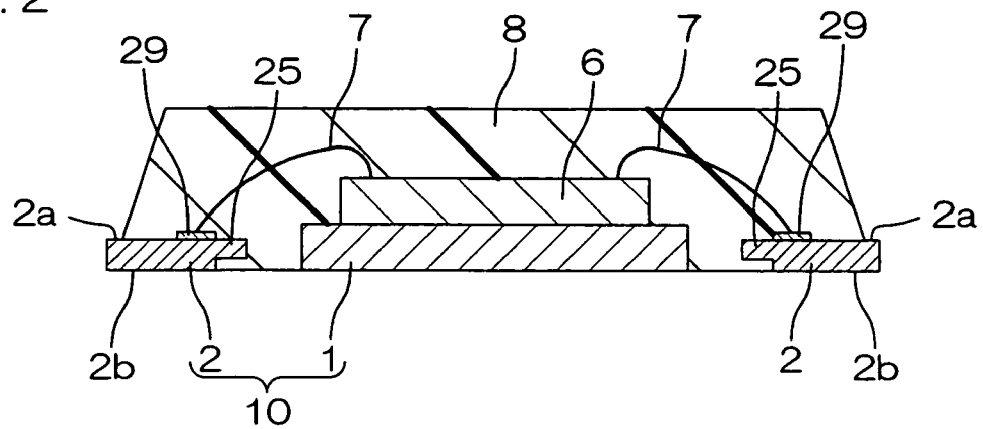
FIG. 2 is an illustrative sectional view showing the configuration of a semiconductor device having the lead frame incorporated therein.

FIG. 2 is an illustrative sectional view showing the configuration of a semiconductor device having the above-mentioned lead frame 10 incorporated therein. The semiconductor device comprises the lead frame 10, a semiconductor chip 6 mounted on the support 1 in the lead frame 10, a bonding wire 7 for electrically connecting the semiconductor chip 6 and an upper surface 2a (a sealed surface) of the lead 2 to each other, and sealing resin 8 for sealing them. A lower surface (a mounting surface) 2b of the lead 2 is exposed from a lower surface of the sealing resin 8, and functions as an outer lead soldered and joined to a wiring pattern on a circuit board. Further, a portion, sealed into the sealing resin, of the lead 2 functions as an inner lead, and a portion near its front end is an inner connecting portion to which the bonding wire 7 is joined. A surface-mounting type semiconductor package (QFN) is thus configured.

In assembling the semiconductor device, the semiconductor chip 6 is die-bonded to an upper surface of the support 1, and a terminal of the semiconductor chip 6 and the upper surface 2a of the lead 2 are connected to each other by the bonding wire 7. Thereafter, an area within a sealing line 50 indicated by a two-dot and dash line in FIG. 1 is resin-sealed with the lower surface 2b of the lead 2 pressed against a metal mold. Consequently, the semiconductor chip 6, the bonding wire 7, and the lead 2 are resin-sealed to form a package. Thereafter, the lead 2 and the hang lead 4 are cut along a side surface of the package, and are cut away from the frame 5. Respective pieces of the semiconductor device are thus obtained.

Figure 3A:
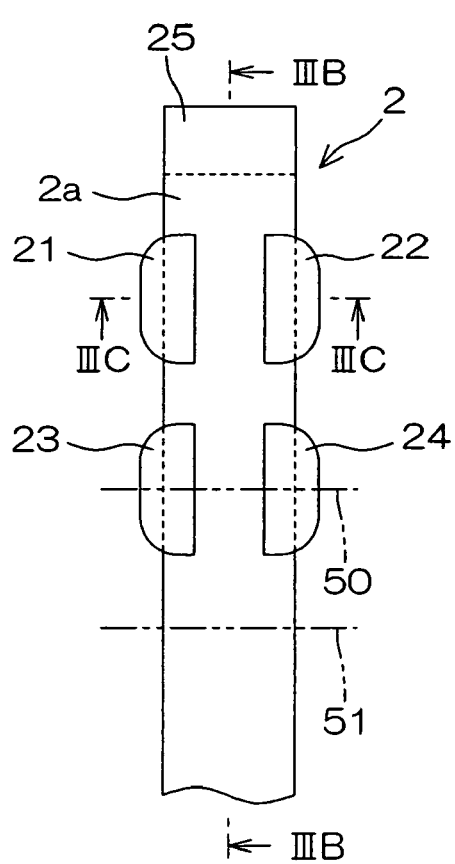
FIG. 3 (a) is a plan view of a lead 2, FIG. 3 (b) is a longitudinal sectional view (a cross-sectional view taken along a line IIIB-IIIB) of FIG. 3 (a), and FIG. 3 (c) is a transverse sectional view (a cross-sectional view taken along a line IIIC-IIIC) of FIG. 3 (a)
Figure 3B:
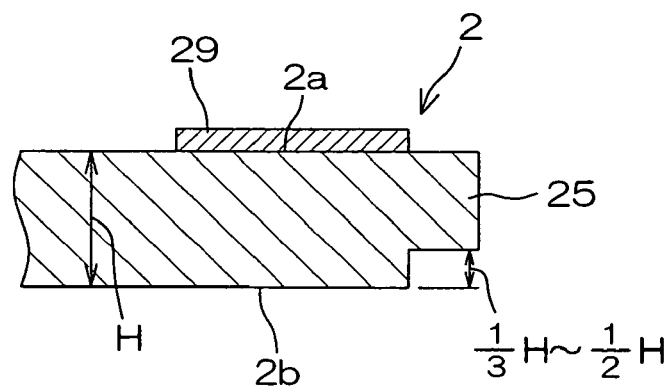
Figure 3C:
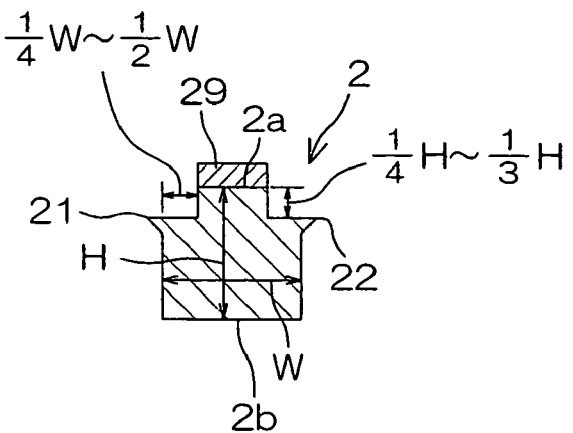

FIG. 3 (*a*) is a plan view of the lead 2, FIG. 3 (*b*) is a longitudinal sectional view (a cross-sectional view taken along a line IIIB-IIIB) of FIG. 3 (*a*), and FIG. 3 (*c*) is a transverse sectional view (a cross-sectional view taken along a line IIIC-IIIC) of FIG. 3 (*a*). Slipping preventing portions 21, 22, 23, and 24 (whose illustration is omitted in FIG. 1) are respectively formed at four positions, two of which are spaced apart from each other in the longitudinal direction at each of both side edges of the upper surface 2a of the lead 2. In the present embodiment, the slipping preventing portions 21, 22, 23, and 24 are provided in an area on the side of the support 1 with respect to a cutting line 51 along which the lead 2 is cut after resin sealing so that the sealing line 50 passes through an intermediate portion in the longitudinal direction of the pair of slipping preventing portions 23 and 24 on the side of the base end of the lead 2. Consequently, the pair of slipping preventing portions 21 and 22 on the side of the front end of the lead 2 enters the sealing resin 8, and the sealing resin 8 also enters between the pair of slipping preventing portions 21 and 22 and the pair of slipping preventing portions 23 and 24. Thus, the slipping preventing portions 21, 22, 23, and 24 can prevent the lead 2 from slipping off in the longitudinal direction.

The slipping preventing portions 21, 22, 23, and 24 are formed by subjecting their side edges to coining processing from the side of the upper surface 2a of the lead 2. More specifically, in an area above a rectangular outer lead to be exposed from the lower surface of the sealing resin 8 after resin sealing on the lower surface 2b of the lead 2, both the side edges of the upper surface 2a of the lead 2 are subjected to coining processing. Consequently, the slipping preventing portions 21, 22, 23, and 24 respectively have upper surfaces lower than the upper surface 2a and have lower surfaces (slipping preventing surfaces, which are inclined surfaces directed upward as they separate from a side surface of the lead 2 in an example shown in FIG. 3) at positions sticking out sideward from the side surface of the lead 2 and higher than the lower surface 2b of the lead 2. Consequently, the sealing resin 8 detours below parts, which stick out, of the slipping preventing portions 21 to 24, thereby making it possible to prevent the lead 2 from slipping off the sealing resin 8 downward. For example, the width of the coining processing of both the side edges of the upper surface 2a for forming the slipping preventing portions 21 to 24 may be approximately 50 μm (approximately one-fourth to one-third of the width W of the lead 2 (e.g., approximately 180 to 200 μm)), and the height thereof may be approximately 50 μm (approximately one-fourth to one-half of the plate thickness H of the lead 2 (e.g., approximately 200 μm)).

On the upper surface 2a of the lead 2, an area from the slipping preventing portions 21 and 22 to the front end (the support 1) functions as a wire connecting portion (an inner connecting portion) to which the bonding wire 7 is joined. A plating layer 29 (e.g., a silver plating layer having a thickness of not more than 5 μm, whose illustration is omitted in FIGS. 1 and 3 (*a*)) for good joining to the bonding wire 7 is formed in the wire connecting portion. The lower surface 2b of the lead 2, together with the semiconductor chip 6, is resin-sealed and is then exposed from the lower surface of the sealing resin 8, to function as an outer connecting portion (an outer lead) for surface-mounting on the circuit board.

An area at the front end of the lead 2 is subjected to coining processing from the side of the lower surface 2b of the lead 2, and a front end slipping preventing portion 25 offset upward from the lower surface 2b of the lead 2 (e.g., by approximately one-third to one-half of the plate thickness H of the lead 2) is formed. The front end slipping preventing portion 25 sticks out, on the upper surface 2a of the lead 2, toward its front end. In a state where the lead 2, together with the semiconductor chip 6, is resin-sealed, the sealing resin 8 detours below the front end slipping preventing portion 25, thereby preventing the lead 2 from slipping off.

FIG. 4 is a conceptual diagram for explaining the configuration of the precision press apparatus used for fabricating the lead frame 10. The lead frame 10 is conveyed in a forward direction R successively through a plurality of (four in an example shown in FIG. 4) press stations S1 to S4. The press station S1 is a punching processing portion for subjecting the band-shaped metal plate 100 which is a material to punching processing from the side of its lower surface. The press station S2 is a front end lower surface coining processing portion for subjecting the front end of the lead 2 to coining processing from the side of the lower surface 2b of the lead 2. The press station S3 is a cutting processing portion for cutting the front end of the lead 2 at a cutting position having a predetermined length from the side of the base end of the lead 2. The press station S4 is a upper surface coining processing portion for subjecting both side edges of the upper surface 2a of the lead 2 to coining processing to form the slipping preventing portions 21 to 24.

Figure 5A:
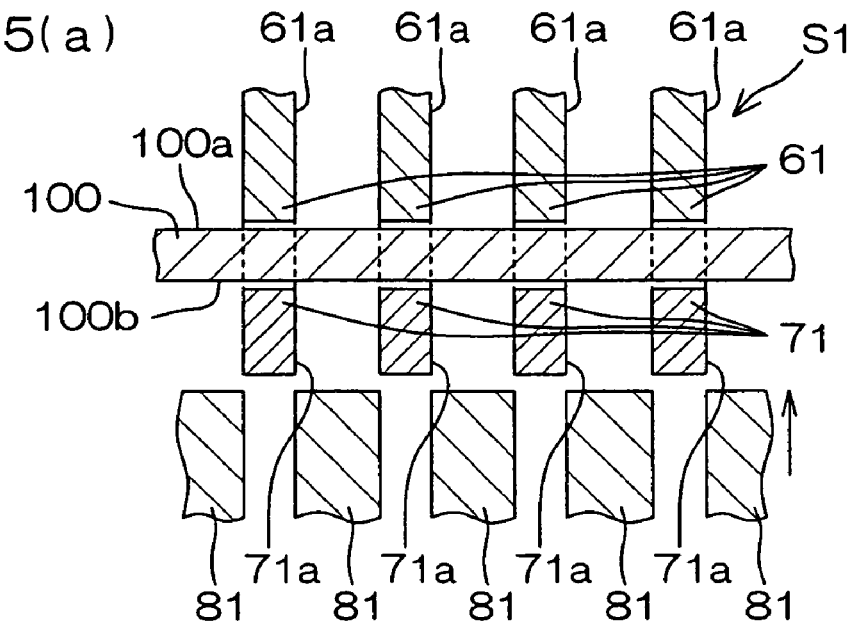
FIGS. 5 (a), 5 (b), and 5 (c) are illustrative sectional views for respectively explaining the configurations of press stations in the precision press apparatus.
Figure 5B:
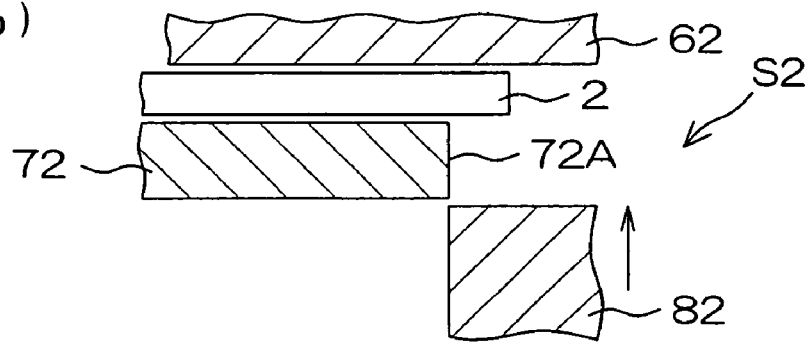
Figure 5C:
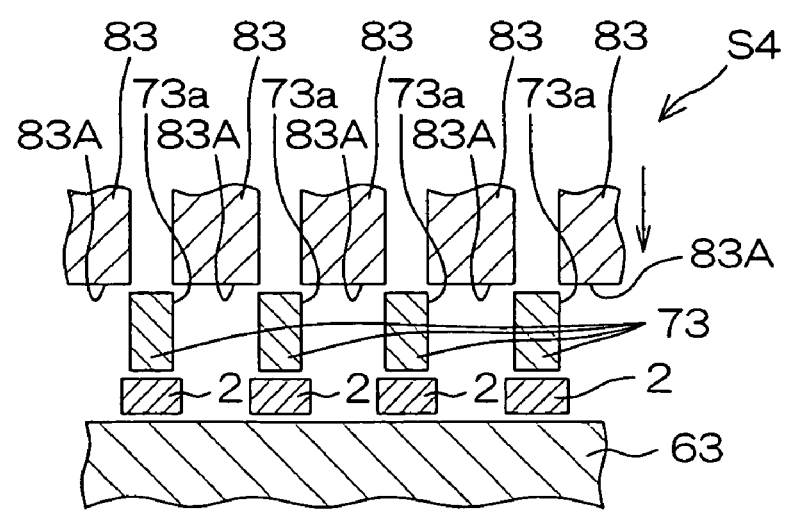

FIG. 5 (*a*) is an illustrative sectional view showing the configuration of the press station S1 (punching processing portion), showing a cross section taken along a plane crossing the longitudinal direction of the lead 2. In the press station S1, the band-shaped metal plate 100 is subjected to punching processing from the side of the lower surface 100b. More specifically, the metal plate 100 is inserted between a die 61 and a suppressing member 71 respectively having openings 61a and 71a corresponding to a pattern of the support 1, the lead 2, or the like. In this state, a punch 81 having a shape conforming to the openings 61a and 71a is moved up and down such that it passes through the openings 71a and 61a to form a hole in the metal plate 100 in a direction from its lower surface 100b to its upper surface 100a, and then it retreats from the openings 61a and 71a. Consequently, the support 1 and the lead 2 are formed by punching processing from the side of the lower surface 2b of the lead 2.

FIG. 5 (b) is an illustrative sectional view showing the configuration of the press station S2 (front end lower surface coining processing portion), showing a state as viewed from the side surface of the lead 2. In the press station S2, the front end slipping preventing portion 25 is formed by coining processing from the side of the lower surface 2b at the front end of the lead 2 obtained by punching processing. More specifically, a die 62 having a flat lower surface is arranged above the lead 2, and a suppressing member 72 is arranged below the metal plate 100. A punch 82 is moved up and down with a predetermined stroke (a stroke corresponding to coining processing which is approximately one-third to one-half the plate thickness H of the lead 2) through an opening 72A formed in the suppressing member 72.

The punch 82 is overlapped with the front end of the lead 2. Therefore, the front end of the lead 2 is coined, and is offset upward from the lower surface 2b of the lead 2. Consequently, the above-mentioned front end slipping preventing portion 25 is formed.

The stroke of the punch 82 is so determined as to be lowered after an upper end of the punch 82 is moved to an intermediate position of the plate thickness of the metal plate 100.

FIG. 5 (c) is an illustrative sectional view showing the configuration of the press station S4 (upper surface coining processing portion), showing a cross section taken along a plane crossing the longitudinal direction of the lead 2. After the front end slipping preventing portion 21 is cut to a predetermined length in the press station S3, both the side edges of the upper surface 2a of the lead 2 are subjected to coining processing in the press station S4. In the press station S4, a die 63 having a flat upper surface is arranged below the leads 2, and suppressing members 73 respectively having openings 73a wider than spacing between the adjacent leads 2 at corresponding positions between the adjacent leads 2 are arranged above the leads 2. A punch 83 which moves up and down through an opening 73a is arranged above the suppressing member 73. The punch 83 has a pressing surface 83A wider than spacing between the adjacent leads 2 at its lower end.

The stroke of the punch 83 is so determined that the position of its lower dead point is within a range of the plate thickness of the main body 20 of the lead 2. By moving the punch 83 up and down, therefore, both the side edges of the lead 2 are pressed from the side of the upper surface 2a over a width of approximately 50 μm (a range which is one-fourth to one-third the width W (e.g., approximately 180 to 200 μm) of the lower surface 2b of the lead 2) and a height of approximately 50 μm (a range which is one-fourth to one-half the plate thickness H of the lead 2 (e.g., approximately 200 μm)). Consequently, the slipping preventing portions 21 to 24 are formed so as to project on both the side surfaces of the lead 2. Correspondingly, the lower surface 2b of the lead 2 is pressed against the die 63, so that a sag occurring at the time of punching processing is flattened.

When the lead frame 10 is thus formed through the press stations S1 to S4, the wire connecting portion is subjected to plating processing (e.g., silver plating processing).

In the present embodiment, the first form of the lead 2 formed by punching processing has a simple form which is approximately rectangular in cross section and is uniform in the longitudinal direction, and a wide part or a constricted part need not be formed therein, as in the above-mentioned prior art. Consequently, the forms of the punch 81, the die 61, and so on for punching processing are not complicated, and their fabrication costs are not too high. Therefore, the fabrication costs of the lead frame 10 and the semiconductor device having the lead frame 10 incorporated therein can be reduced.

Moreover, the slipping preventing portions 21 to 24 are formed by coining processing not from the side of the lower surface 2b of the lead 2 but from above both the side edges of the upper surface 2a of the lead 2. Therefore, the side edges of the lower surface 2b of the lead 2 serving as an outer lead can keep its initial linear shape, thereby making it possible to ensure good mounting properties on the wiring substrate.

No burr occurs in the above-mentioned coining processing from above both the side edges of the upper surface 2a of the lead 2 having the above-mentioned simple form, so that no special measures as in the above-mentioned prior art are required.

Although in the above-mentioned embodiment, the slipping preventing portions 21 to 24 are respectively formed at four positions, two of which are spaced apart from each other along the longitudinal direction at each of both side edges of the upper surface 2a of the lead 2, one similar slipping preventing portion or three or more similar slipping preventing portions may be formed at each of the side edges of the upper surface 2a of the lead 2. Slipping preventing portions over almost the entire length of the lead 2 may be formed by coining processing at both the side edges of the upper surface 2a. Similar slipping preventing portion or portions may be formed only at one of the side edges of the upper surface 2a of the lead 2.

Figure 6:
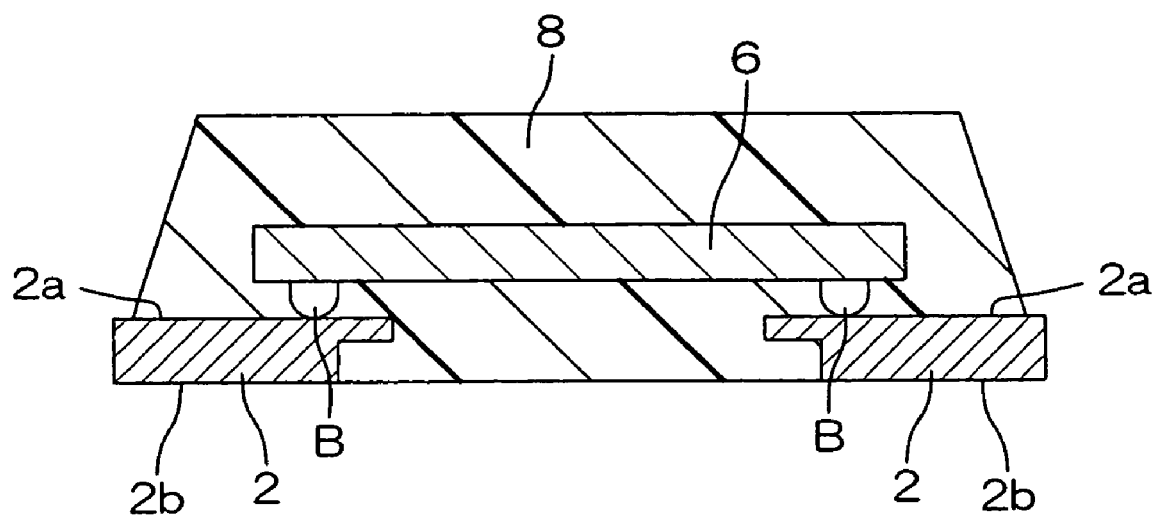
FIG. 6 is an illustrative sectional view showing the configuration of a semiconductor device according to another embodiment of the present invention.

Although in the above-mentioned embodiment, description has been made of an example in which the lead 2 and the semiconductor chip 6 are electrically connected to each other through the bonding wire 7, the lead 2 and the semiconductor chip 6 may be connected to each other wirelessly by providing a bump B at the terminal of the semiconductor chip 6 and joining the bump B to the upper surface 2a of the lead 2, as shown in FIG. 6. Before the joining, the bump B may be provided in at least one of the semiconductor chip 6 and the lead 2. That is, the bump B may be provided in the lead 2. Alternatively, bumps may be respectively provided in both the semiconductor chip 6 and the lead 2.

Although in the above-mentioned embodiment, in the steps of processing the metal plate 100 to fabricate the lead frame 10, processing by the press station S1 to S4 is performed in a state where the upper surface of the lead frame 10 is directed upward and the lower surface thereof is directed downward, the processing in each of the steps may be performed in a state where the upper surface of the lead frame 10 is directed downward and the lower surface thereof is directed upward. In this case, the vertical relationship among the punch, the suppressing member, and the die in the press stations S1 to S4 is preferably reversed.

Although in the above-mentioned embodiment, a series of processing steps for fabricating the lead frame 10 is continuously performed by one precision press apparatus, some of the steps may be performed by another apparatus.

Figure 7:
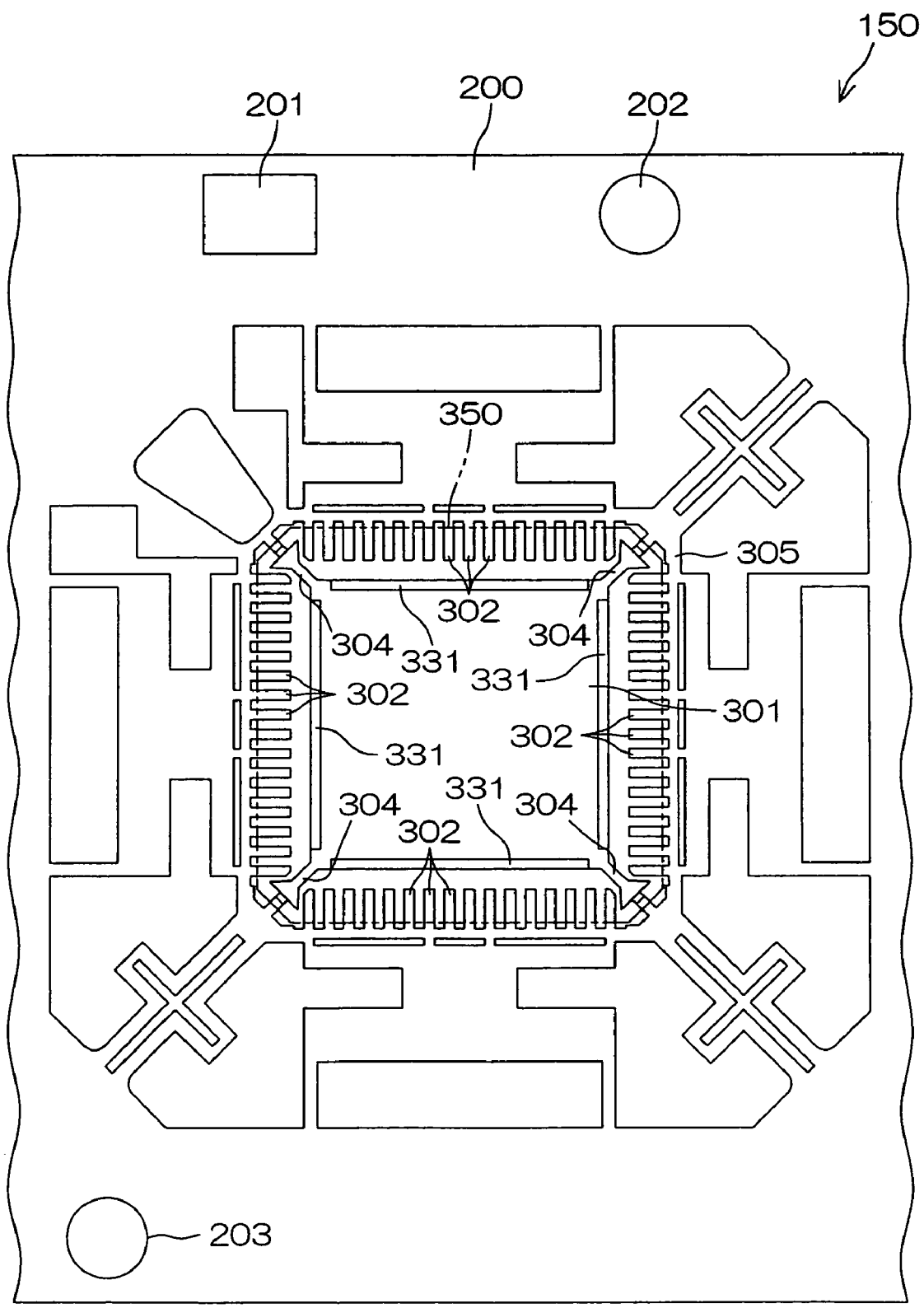
FIG. 7 is a plan view showing the configuration of a lead frame according to still another embodiment of the present invention.

FIG. 7 is a plan view showing the configuration of a lead frame according to another embodiment of the present invention. FIG. 7 illustrates a unit portion corresponding to one semiconductor device. But in practice, unit portions corresponding to a plurality of semiconductor devices are connected to one another in a left-to-right direction in FIG. 7, thereby constituting a band-shaped chain member as a whole.

The lead frame 150 is fabricated by subjecting a metal plate (particularly a copper plate, for example, having a plate thickness of approximately 200 μm) 200 to precision press processing. A unit portion corresponding to one semiconductor device has a rectangular shape (an approximately square shape in an example of FIG. 7), and has a support (an island) 301 for supporting a semiconductor chip at its center and has a plurality of leads 302 arranged at approximately equal spacing so as to form an imaginary rectangular shape around its periphery.

A support 301 has a rectangular shape as viewed from the top and is coupled to a frame 305 connecting with the metal plate 200 through hang leads 4 at four corners of the imaginary rectangular shape formed by the plurality of leads 302 in the present embodiment. Each of the leads 302 has a longitudinal shape arranged with its front end directed toward the support 301, and has its base end coupled to the frame 305. The plurality of leads 302 arranged along each of the sides of the rectangular shape are parallel to one another, and the longitudinal direction thereof is along a direction nearly perpendicular to the side. Reference numerals 201, 202, and 203 denote positioning holes for positioning the lead frame 150 in a processing step in each of press stations in a precision press apparatus, a mounting step for mounting the semiconductor chip, a sealing step for sealing with the sealing resin, and so on.

Figure 8A:
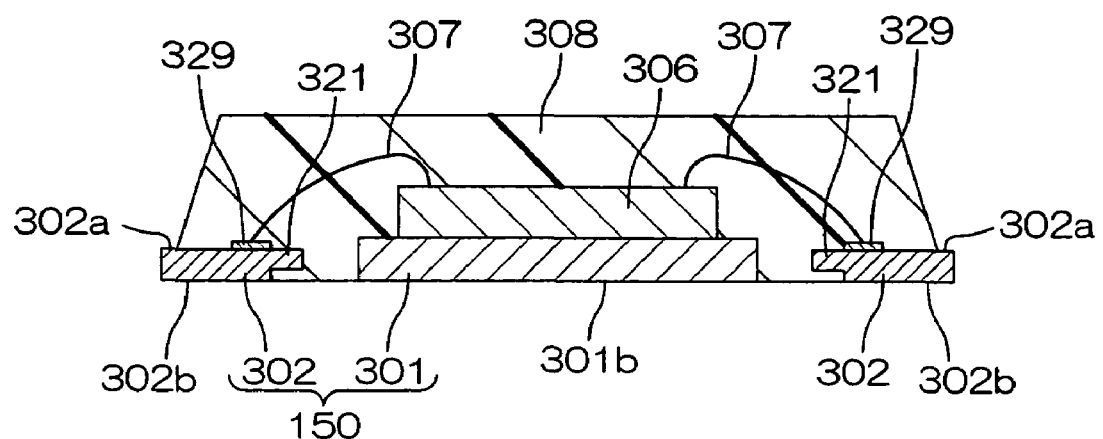
FIGS. 8 (a) and 8 (b) are illustrative sectional views showing the configuration of a semiconductor device having a lead frame incorporated therein.
Figure 8B:
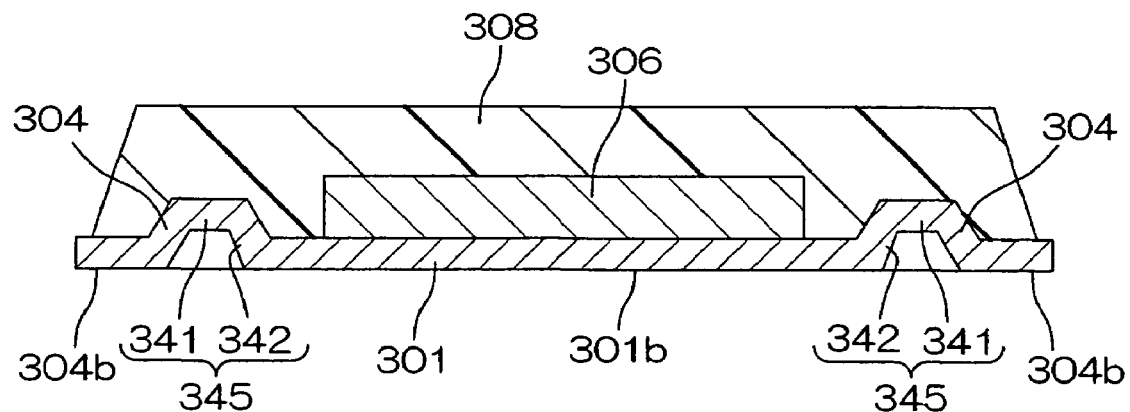

FIG. 8 (a) is an illustrative sectional view showing the configuration of a semiconductor device having the above-mentioned lead frame 150 incorporated therein. The semiconductor device comprises the lead frame 150, a semiconductor chip 306 mounted on the support 301 in the lead frame 150, a bonding wire 307 for electrically connecting the semiconductor chip 306 and an upper surface 302a of the lead 302 to each other, and sealing resin 308 for sealing them.

A lower surface 302b serving as a mounting surface of the lead 302 is exposed from a lower surface of the sealing resin 308, and functions as an outer lead soldered and joined to a wiring pattern on a circuit board. Further, a portion, sealed into the sealing resin 308, of the lead 302 functions as an inner lead, and a portion near its front end is an inner connecting portion to which the bonding wire 307 is joined. On the other hand, the support 301 has its lower surface serving as an exposed surface exposed from the lower surface of the sealing resin 308, and heat generated by the semiconductor chip 306 is dispersed through the lower surface of the support 301. A surface-mounting type semiconductor package (HQFN) having a heat dispersion structure is thus configured.

In assembling the semiconductor device, the semiconductor chip 306 is die-bonded to an upper surface (sealed surface) of the support 301, and a terminal of the semiconductor chip 306 and the upper surface 302a of the lead 302 are connected to each other by the bonding wire 307. Thereafter, a sealing area 350 indicated by a two-dot and dash line in FIG. 7 is resin-sealed. Consequently, the semiconductor chip 306, the bonding wire 307, and the lead 302 are resin-sealed to form a package. Thereafter, the lead 302 and the hang lead 304 are cut along a side surface of the package, and are cut away from the frame 305. Respective pieces of the semiconductor device are thus obtained.

The upper surface 302a of the lead 302 functions as a wire connecting portion (an inner connecting portion) to which the bonding wire 7 is joined. A plating layer 329 (e.g., a silver plating layer having a thickness of not more than approximately 5 μm) for good joining to the bonding wire 307 is formed in the wire connecting portion. On the other hand, the lower surface 302b of the lead 302, together with the semiconductor chip 306, is resin-sealed and is then exposed from the lower surface of the sealing resin 308, to function as an outer connecting portion (an outer lead) for surface-mounting on the circuit board.

An area at the front end, on the side of the support 301, of the lead 302 is subjected to coining processing from the side of the lower surface 302b of the lead 302, and a front end slipping preventing portion 321 offset upward from the lower surface 302b of the lead 302 by approximately one-third to one-half of the plate thickness of the lead 302 is formed. The front end slipping preventing portion 321 sticks out, on the upper surface 302a of the lead 302, toward its front end. In a state where the lead 302, together with the semiconductor chip 306, is resin-sealed, the sealing resin 308 detours below the front end slipping preventing portion 321, thereby preventing the lead 302 from slipping off.

FIG. 8 (b) is a diagram showing a cross-sectional shape along a diagonal line in a rectangular shape formed by a plurality of leads 302. In a state where the lead 302 is sealed with the sealing resin 308, a lower surface 301b of the support 301, the lower surface 302b of the lead 302, and a lower surface 304b at an outer end (a base end) of the hang lead 304, together with the lower surface of the sealing resin 308, are positioned so as to be flush with one another. The hang lead 304 comprises an elastic deformation portion 345 having an up-set portion 341 set upward with respect to the support 301 and a connecting portion 342 for connecting the up-set portion 341 to the support 301. Before the lead 302 is sealed with the sealing resin 308, the support 301 is set downward with respect to the lead 302. At the time of resin sealing, the elastic deformation portion 345 is elastically deformed so that the elastic deformation portion 345 is arranged so as to be flush with the lead 302.

Figure 9A:
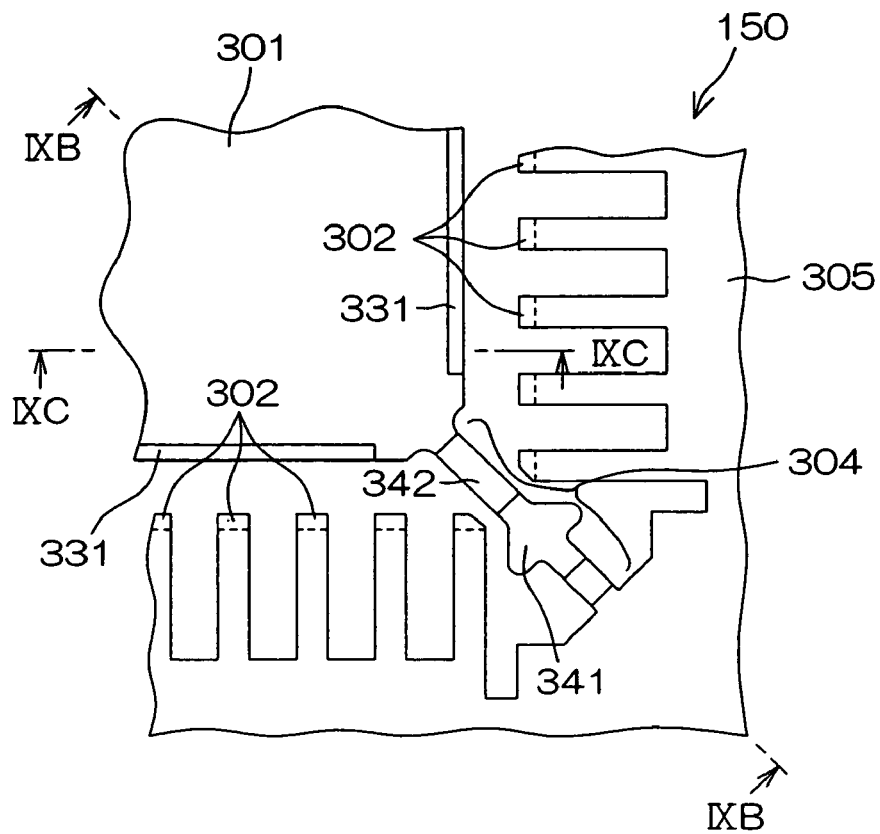
FIG. 9 (a) is a partially enlarged plan view of a support in the lead frame, FIG. 9 (b) is a longitudinal sectional view (a cross-sectional view taken along a line IXB-IXB in FIG. 9 (a)) of a support and a hang lead, and FIG. 9 (c) is a transverse sectional view (a cross-sectional view taken along a line IXC-IXC in FIG. 9 (a)) at an edge of the support.
Figure 9B:
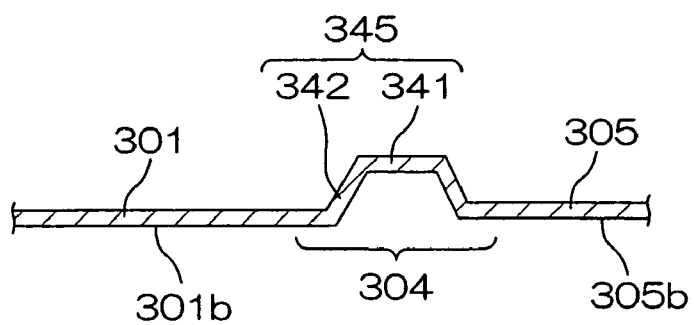
Figure 9C:
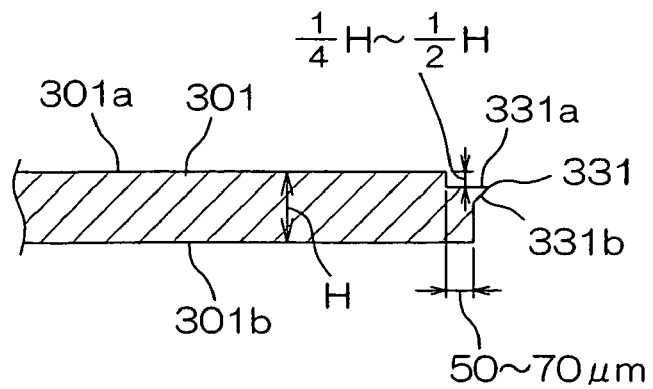
Figure 11A:
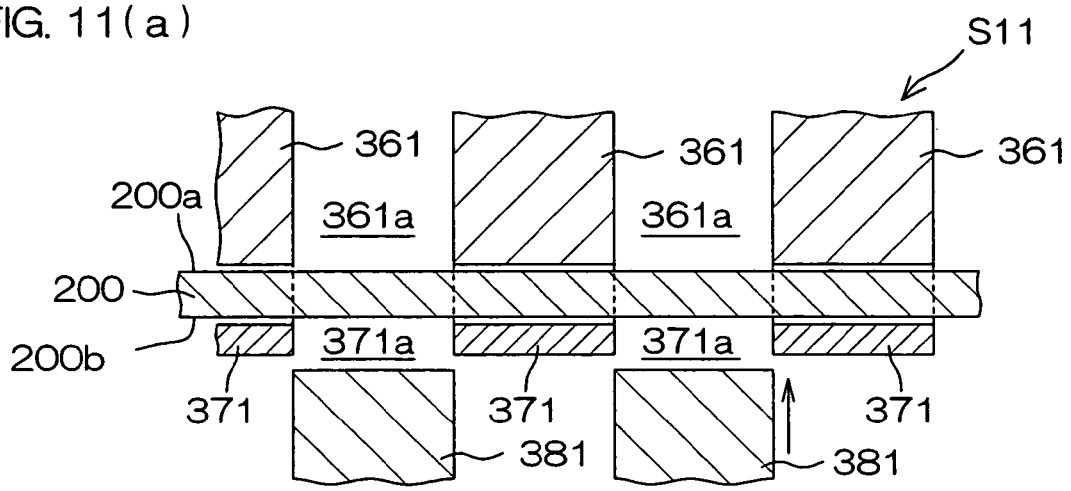
FIGS. 11 (a) to 11 (d) are illustrative sectional views for respectively explaining the configurations of press stations in the precision press apparatus.
Figure 11B:
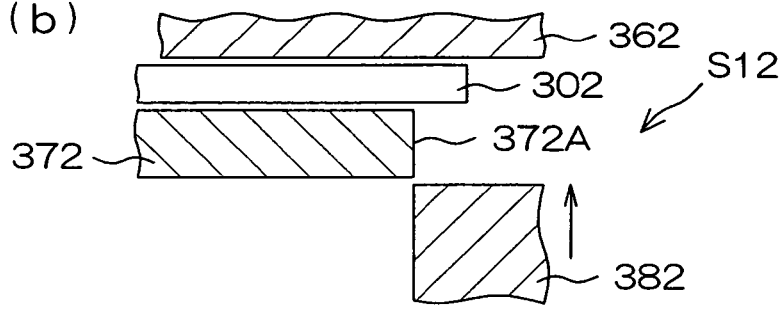
Figure 11C:
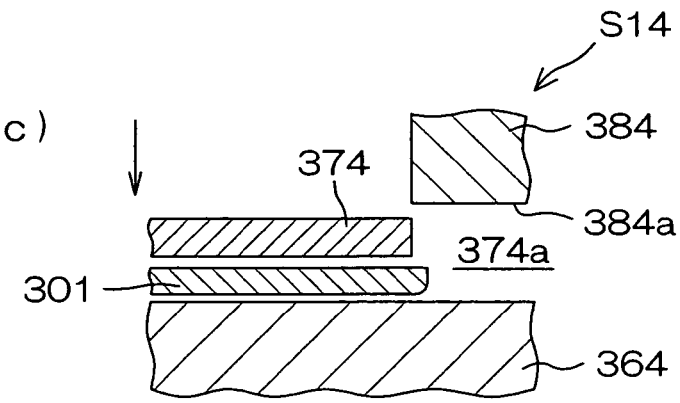
Figure 11D:
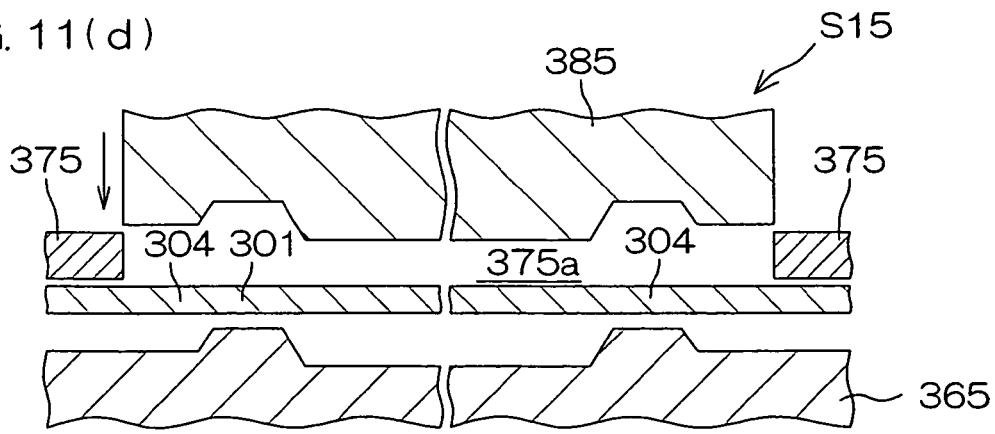

FIG. 9 (a) is a partially enlarged plan view of the support 301, FIG. 9 (b) is a longitudinal sectional view (a cross-sectional view taken along a line IXB-IXB in FIG. 9 (a)) of the support 301 and the hang lead 304, and FIG. 9 (c) is a transverse sectional view (a cross-sectional view taken along a line IXC-IXC in FIG. 9 (a)) at an edge of the support 301. In almost the whole area of each of the sides of the rectangular support 301, a slipping preventing projection 331 by coining processing from the side of an upper surface of the support 301 is formed. The slipping preventing projection 331 has an upper surface 331a lower than the upper surface 301a of the other part of the support 301 by the height of the coining processing (e.g., approximately one-fourth to one-half of the plate thickness of the support 301) and a lower surface 331b higher than the lower surface 301b of the support 301, and projects sideward from an intermediate position of the plate thickness on the side surface of the support 301. When the lead 302 is sealed with the sealing resin 308, therefore, the sealing resin 308 detours below the slipping preventing projection 331, thereby making it possible to prevent the support 301 from slipping off the sealing resin 308 downward. The width of the coining processing is approximately 50 to 70 μm, for example.

On the other hand, the hang lead 304 connects the support 301 and the frame 305 to each other such that the lower surface 301b of the support 301 is set downward to a position lower than a lower surface 305b of the frame 305 (e.g., the difference in height is less than the plate thickness, which is approximately 50 μm to 150 μm), as shown in FIG. 9 (b). The lower surface 305b of the frame 305 is flush with the lower surface 302b of the lead 302. Therefore, the support 301 is eventually set downward such that the lower surface 301b is lower than the lower surface 302b of the lead 302 (the whole of the support 301 is lower than the lower surface 302b of the lead 302 in the present embodiment).

More specifically, the hang lead 304 has the up-set portion 341 set upward to a position higher than an upper surface 305a of the frame 305 on the side of the frame 305. The up-set portion 341 and the support 301 are connected to each other by the connecting portion 342. The connecting portion 342 is formed in an inclined posture which falls toward the support 301, to support the support 301 at a position lower than the lower surface 305b of the frame 305. That is, the hang lead 304 is roughly molded in an S shape, and the elastic deformation portion 345 including the up-set portion 341 and the connecting portion 342 is elastically deformed to allow the up-and-down motion of the support 301 while holding the relative positional relationship as viewed from the top among the support 301, the frame 305, and the lead 302 when an external force in the vertical direction is applied to the support 301.

FIG. 10 is a conceptual diagram for explaining the configuration of the precision press apparatus used for fabricating the lead frame 150. The lead frame 150 is conveyed in a forward direction R10 successively through a plurality of (five in an example shown in FIG. 10) press stations S11 to S15. The press station S11 is a punching processing portion for subjecting the band-shaped metal plate 200 which is a material to punching processing from the side of its lower surface. The press station S12 is a front end lower surface coining processing portion for subjecting the front end of the lead 302 to coining processing from the side of the lower surface 302b. The press station S13 is a cutting processing portion for cutting the front end of the lead 302 at a cutting position having a predetermined length from the side of the base end of the lead 302. The press station S14 is a coining processing portion for subjecting the whole area at the edge of the support 301 to coining processing from the side of the upper surface 301a. The press station S15 is a hang lead molding processing portion for molding the hang lead 304 in the above-mentioned S shape.

Figure 12:
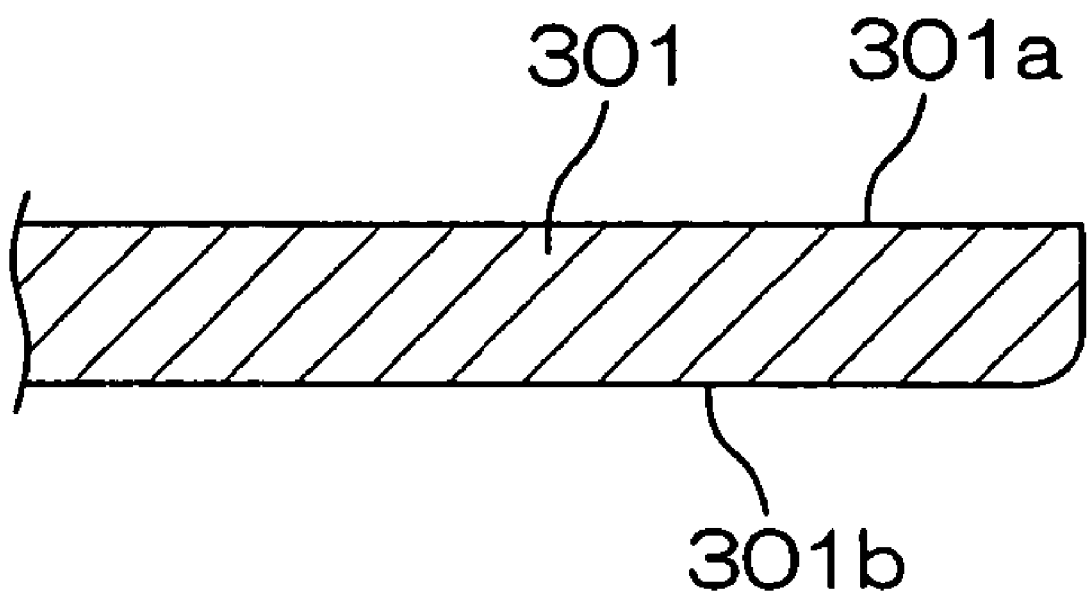
FIG. 12 is a cross-sectional view showing the cross-sectional shape of a support after punching processing.

FIG. 11 (a) is an illustrative sectional view showing the configuration of the press station S11 (punching processing portion), showing a cross section of a portion corresponding to the support 301. In the press station S11, the band-shaped metal plate 200 is subjected to punching processing from the side of the lower surface 200b. More specifically, the metal plate 200 is inserted between a die 361 and a suppressing member 371 respectively having openings 361a and 371a corresponding to a pattern of the support 301, the lead 302, or the like. In this state, a punch 381 having a shape conforming to the openings 361a and 371a is moved up and down such that it passes through the openings 371a and 361a such to form a hole in the metal plate 200 in the direction from its lower surface 200b to its upper surface 200a, and then it retreats from the openings 361a and 371a. Consequently, the support 301 and the lead 302 are formed by punching processing from the side of the lower surface 302b of the lead 302. Consequently, a burr occurring by the punching processing does not project downward but is sealed into the sealing resin 308 after resin sealing. Therefore, a posterior processing step for eliminating the burr is not required. By the punching processing from the side of the lower surface 301b, however, an edge on the side of the lower surface 301b is brought into a curved surface as shown in FIG. 12, so that a so-called sag occurs at the edge of the support 301.

FIG. 11 (b) is an illustrative sectional view showing the configuration of the press station S12 (front end lower surface coining processing portion), showing a state as viewed from the side surface of the lead 302. In the press station S12, the front end slipping preventing portion 321 is formed by coining processing from the side of the lower surface 302b at the front end of the lead 302 obtained by punching processing. More specifically, a die 362 having a flat lower surface is arranged above the lead 302, and a suppressing member 372 is arranged below the metal plate 200. A punch 382 is moved up and down with a predetermined stroke through an opening 372A formed in the suppressing member 372. The stroke of the punch 382 is so determined as to be lowered after an upper end of the punch 382 is moved to an intermediate position of the plate thickness of the metal plate 200.

The punch 382 is overlapped with the front end of the lead 302. Therefore, the front end of the lead 302 is coined and is offset upward from the lower surface 302b of the lead 302. Consequently, the above-mentioned front end slipping preventing portion 321 is formed.

FIG. 11 (c) is an illustrative sectional view showing the configuration of the press station S14 (coining processing portion), showing a configuration taken along the same cross section as that shown in FIG. 9 (c). After the front end slipping preventing portion 321 is cut to a predetermined length in the press station S13, the entire edge of the support 301 is subjected to coining processing from the side of the upper surface 301a. That is, in the press station S14, a die 364 having a flat upper surface is arranged below the support 301, and a suppressing member 374 for pressing portions, corresponding to the lead 302, the frame 305, and so on, other than the support 301 is arranged above the metal plate 200, as shown in FIG. 11 (c). The suppressing member 374 is formed with an opening 374a for exposing the entire edge of the support 301, and is provided with a punch 384 so as to be movable up and down through the opening 374a. The punch 384 has a pressing surface 384a which can press the entire edge of the support 301 on its lower surface.

The up-and-down stroke of the punch 384 is so set that the position of a lower dead point of the pressing surface 384a is below (e.g., only one-fourth to one-half of the plate thickness of the lead 302 below) the upper surface 302a of the lead 302 before the coining processing.

The cross-sectional shape of the support 301 after the coining processing from the side of the upper surface 301a is as shown in FIG. 9 (c). That is, the above-mentioned slipping preventing projection 331 is formed by the coining processing of the edge from the side of the upper surface 331a. Correspondingly, the sag occurring at the edge of the lower surface is eliminated by the coining processing from the side of the upper surface 331a. Accordingly, the support 301 is an approximately flat plane up to its edge, and the edge is a raised surface which is raised at an angle of approximately 90 degrees. When the lead 302 is sealed with the sealing resin 308, therefore, the sealing resin 308 can be prevented from effectively detouring toward the edge of the lower surface 301b of the support 301.

FIG. 11 (d) is an illustrative sectional view showing the configuration of the press station S15 (hang lead molding processing portion), showing a cross section along the longitudinal direction of the hang lead 304. In the press station S15, a die 365 having an irregular pattern, corresponding to the shapes of the lower surfaces of the hang lead 304 and the support 301 after molding, carved on its upper surface is arranged below the hang lead 304 and the support 301, and a punch 385 having an irregular pattern, corresponding to the shapes of the upper surfaces of the hang lead 304 and the support 301 after molding, carved on its lower surface is arranged above the hang lead 304 and the support 301. A suppressing member 375 having an opening 375a corresponding to areas of the hang lead 304 and the support 301 is arranged above the metal plate 200, and the punch 385 can be moved up and down with a predetermined stroke through the opening 375a.

The metal plate 200 is subjected to press molding processing by moving the punch 385 up and down to apply pressure with the metal plate 200 interposed between respective carving surfaces of the punch 385 and the die 365. Consequently, the hang lead 304 is molded in the above-mentioned shape having the up-set portion 341 and the connecting portion 342, and the support 301 is set downward with respect to the lower surface of the frame 305.

When the lead frame 150 is thus formed through the press stations S11 to S15, the wire connecting portion is subjected to plating processing (e.g., silver plating processing). The plating processing may be performed before the hang lead molding processing step by the press station S15.

FIGS. 13 (a) to 13 (e) are illustrative sectional views for explaining the resin sealing step, where FIG. 13 (a) illustrates a cross section corresponding to that shown in FIG. 8 (a), and FIG. 13 (b) illustrates a cross section corresponding to that shown in FIG. 8 (b).

An assembly obtained by die-bonding the semiconductor chip 306 on the upper surface of the support 301 in the lead frame 150 fabricated in the above-mentioned manner and electrically connecting the terminal (pad) of the semiconductor chip 306 and the lead 302 to each other using the bonding wire 307 is placed between a lower metal mold 110 having a flat upper surface and an upper metal mold 120 having a recess forming a cavity 115 into which the sealing resin 308 flows on its lower surface.

The upper metal mold 120 has paths 116 and 117 for respectively pulling the base ends of the lead 302 and the hang lead 304 out of the cavity 115 formed on its lower surface. When the upper metal mold 120 and the lower metal mold 110 are abutted against each other in close proximity, each of the base ends of the lead 302 and the hang lead 304 is interposed between the upper metal mold 120 and the lower metal mold 110 within the paths 116 and 117.

On the other hand, the support 301 is set downward with respect to the lead 302. Therefore, the support 301 is pushed upward in the step of interposing the lead 302 and the hang lead 304 by the upper metal mold 120 and the lower metal mold 110, so that the elastic deformation portion 345 in the hang lead 304 is elastically deformed. Finally, the lower surface 301b of the support 301 and the lower surface 302b of the lead 302 are arranged so as to be flush with each other. At this time, the support 301 is pressed against the flat upper surface of the lower metal mold 110 due to a restoring force of the hang lead 304. If the sealing resin 308 is injected into the cavity 115 in this state, the above-mentioned assembly can be satisfactorily sealed without causing the sealing resin 308 to detour toward the lower surface of the support 301. Consequently, the semiconductor device finally obtained can satisfactorily disperse heat generated by the semiconductor chip 306 from the lower surface of the support 301.

Figure 14:
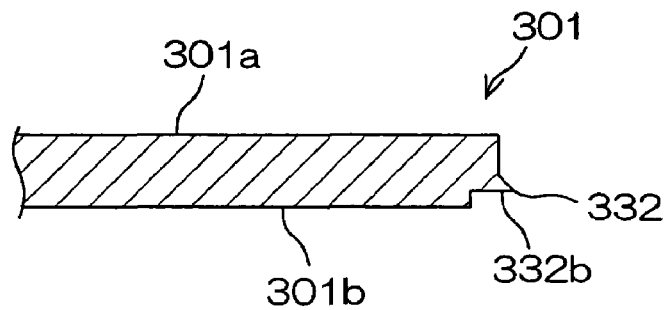
FIG. 14 is a cross-sectional view of an edge of a support in a lead frame according to still another embodiment of the present invention.

FIG. 14 is a diagram for explaining the configuration of a still another embodiment of the present invention, illustratively showing the cross section of a support for supporting a semiconductor chip. In the above-mentioned embodiment, the upper surface 301a at the edge of the support 301 is subjected to coining processing to form the slipping preventing projection 331. On the other hand, in the present embodiment, a lower surface 301b at an edge of the support 301 is subjected to coining processing to form a slipping preventing projection 332 having the same function. The slipping preventing projection 332 has a lower surface 332b offset upward from the lower surface 301b of the support 301. Therefore, sealing resin 308 detours below the lower surface 332b, thereby making it possible to achieve slipping prevention of the support 301.

The slipping preventing projection 332 can be formed by a configuration in which the suppressing member 374, the punch 384, and the die 364 are reversed in the vertical direction in the configuration shown in FIG. 11 (c).

Figure 15:
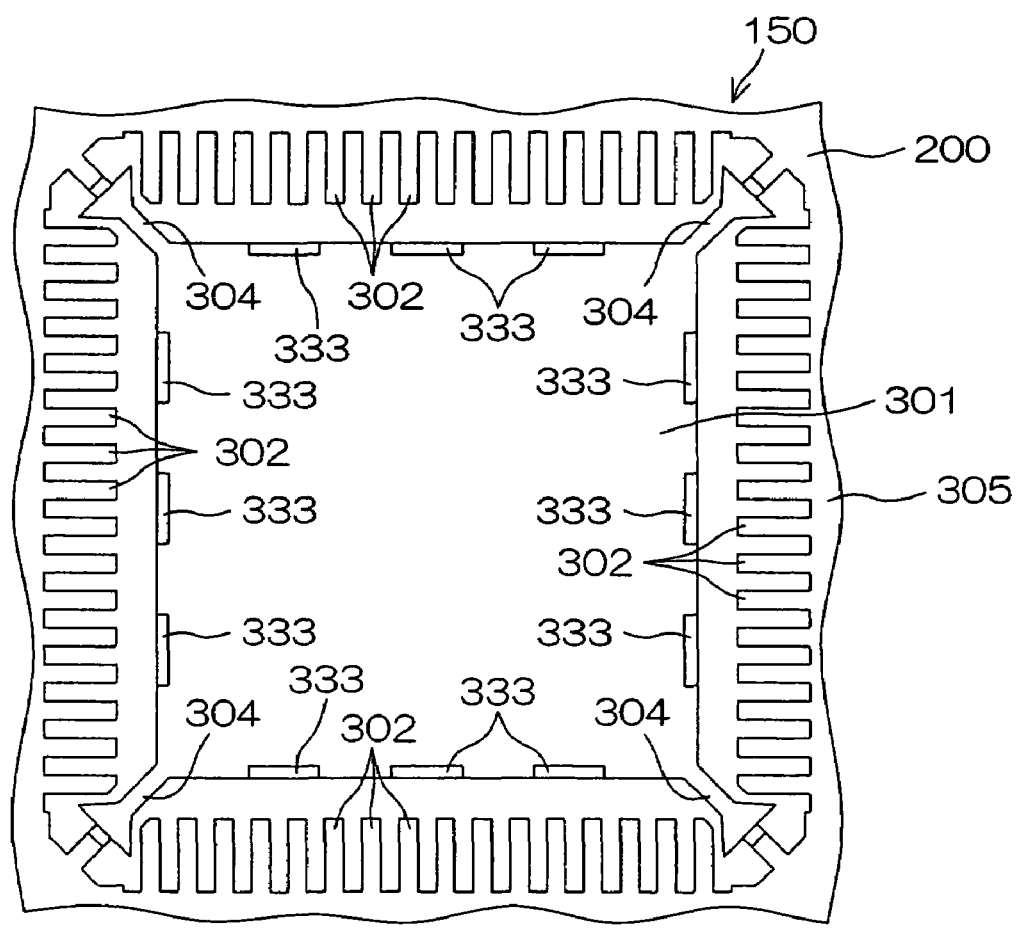
FIG. 15 is a plan view of a lead frame according to a further embodiment of the present invention.

Although in the above-mentioned embodiment, the whole area at the edge of the support 301 is subjected to coining processing from the side of an upper surface 301a or the lower surface 301b of the support 301, a good slipping preventing projection 333 can be formed if an area which is a part of an edge of a support 301 (a plurality of positions spaced apart from one another in an example shown in FIG. 15) is subjected to coining processing from the side of its upper surface or lower surface, as shown in FIG. 15, for example.

Figure 16A:
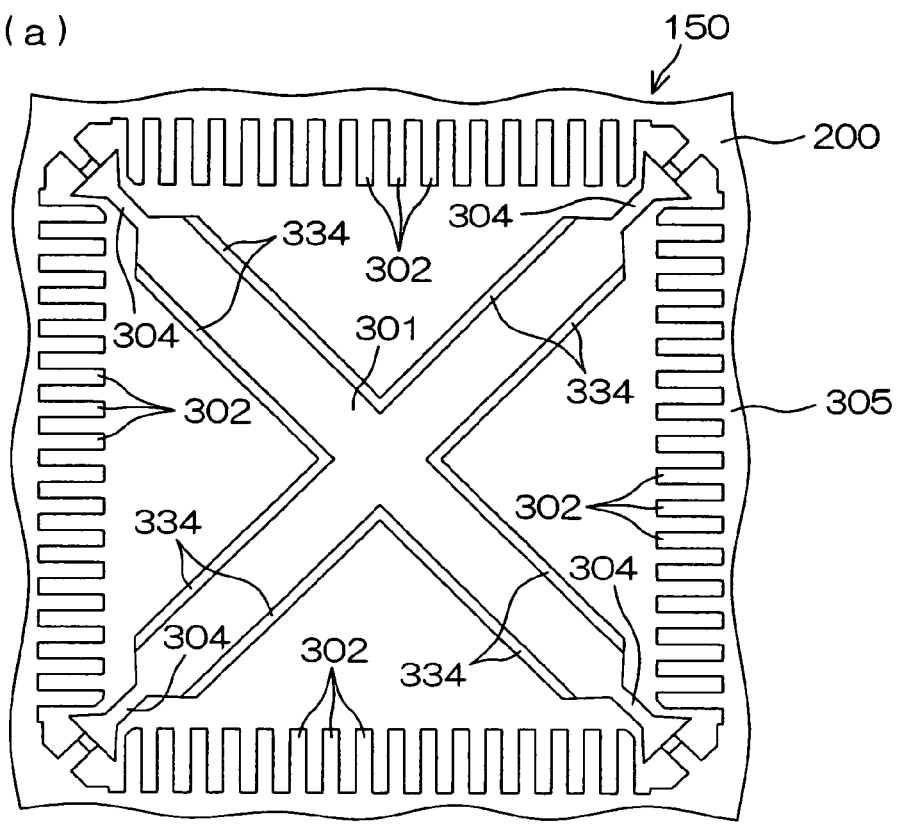
FIGS. 16 (a) and 16 (b) are plan views showing a lead frame according to a still further embodiment of the present invention.
Figure 16B:
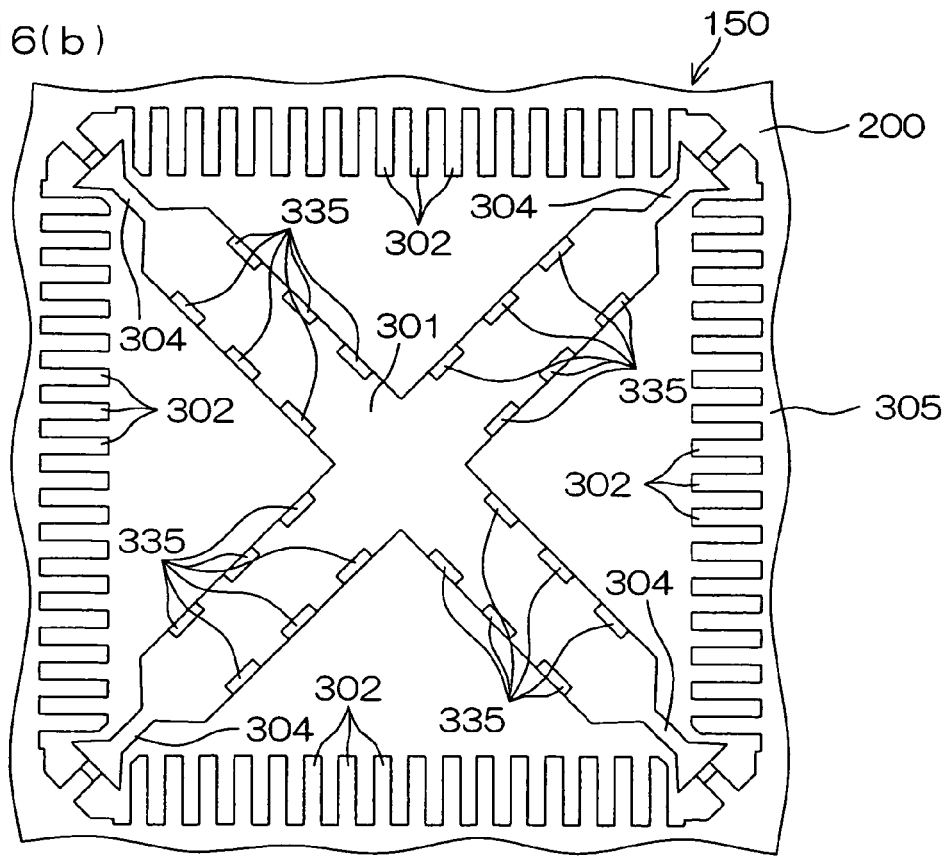

Although in the above-mentioned embodiment, description has been made of the example in which the support 301 is formed in a rectangular shape, the support 301 may be formed in an approximately X shape, as shown in FIGS. 16 (a) and 16 (b). In an example shown in FIG. 16 (a), almost the whole area at an edge of the support 301 in an X shape is subjected to coining processing from the side of its upper surface or lower surface, thereby forming a slipping preventing projection 334. In an example shown in FIG. 16 (b), a slipping preventing projection 335 is formed by subjecting a part of the edge of the support 301 (specifically, at a plurality of positions spaced apart from one another at each of edges of the support 301) to coining processing from the side of the upper surface or the lower surface.

Although in the above-mentioned embodiment, description has been made of the example in which the lead 302 and the semiconductor chip 306 are electrically connected to each other through the bonding wire 307, a bump may be provided at a terminal of the semiconductor chip 306, and may be joined to the upper surface 302a of the lead 302.

Although in the above-mentioned embodiment, in the step of processing the metal plate 200 to fabricate the lead frame 150, processing by each of the press station S11 to S15 is performed in a state where the upper surface of the lead frame 150 is directed upward and the lower surface thereof is directed downward, the processing in each of the steps may be performed in a state where the upper surface of the lead frame 150 is directed downward and the lower surface thereof is directed upward. In this case, the vertical relationship among the punch, the suppressing member, and the die in the press stations S11 to S15 is preferably reversed.

Although in the above-mentioned embodiment, a series of processing steps for fabricating the lead frame 150 is continuously performed by one precision press apparatus, some of the steps may be performed by another apparatus.

Although the present invention has been described and illustrated in detail, it is clearly understood that the same is by way of illustration and example only and is not to be taken by way of limitation, the spirit and scope of the present invention being limited only by the terms of the appended claims.

The present application corresponds to Japanese patent application Nos. 2003-389770 and 2003-389771 filed with the Japanese Patent Office on Nov. 19, 2003, the disclosure of which is hereinto incorporated by reference.

What is claimed is:

1. A method of fabricating a lead frame for a semiconductor device having a semiconductor chip resin-sealed therein, the lead frame including a lead to be electrically connected to the semiconductor chip within sealing resin and to be sealed into the sealing resin such that at least a part of a mounting surface thereof is exposed from the sealing resin, the method comprising:
   a lead forming step for forming the lead;
   a side edge coining step for subjecting a side edge of a sealed surface, which is a surface on an opposite side of the mounting surface, of the lead to coining processing from a side of the sealed surface, to form a slipping preventing portion projecting sideward from the lead and having a slipping preventing surface between the mounting surface and the sealed surface of the lead;
   a step of electrically connecting the sealed surface of the lead and the semiconductor chip to each other;
   a step of resin-sealing the lead frame, together with the semiconductor chip, such that at least a part of the mounting surface of the lead is exposed; and
   a step of cutting away an unnecessary part of the lead frame.

2. The method according to claim 1, wherein
the lead forming step includes a step of forming the lead in a longitudinal shape, and
the side edge coining step includes a step of forming the slipping preventing portions at a plurality of positions spaced apart from one another in the longitudinal direction of the lead.

3. The method according to claim 1, wherein
the lead forming step includes a step of forming the lead in a longitudinal shape, and
the side edge coining step includes a step of forming the slipping preventing portions at both side edges of the sealed surface of the lead.

4. The method according to claim 1, wherein
the lead forming step includes a punching processing step for a metal plate which is a material for the lead frame.

5. The method according to claim 1, wherein
the step of resin-sealing the lead frame includes a step of sealing the semiconductor chip and the lead frame with the sealing resin such that an end surface of the sealing resin crosses the slipping preventing portion.

6. A method of fabricating a lead frame for a semiconductor device having a semiconductor chip resin-sealed therein, the lead frame including a chip support to have the semiconductor chip carried thereon and having one surface serving as an exposed surface exposed from the sealing resin and the other surface serving as a sealed surface sealed into the sealing resin, the method comprising:
   a step of shaping a metal plate to form the chip support,
   a step of subjecting an edge of the chip support to coining processing from a side of the exposed surface or the sealed surface, and forming a slipping preventing portion sticking out sideward from an edge of the chip support at a position between the exposed surface and the sealed surface of the chip supports
   a step of forming a lead to be electrically connected to the semiconductor chip within the sealing resin and to be sealed into the sealing resin such that at least a part of a mounting surface thereof which is a surface on the same side of the exposed surface of the chic, support is exposed from the sealing resin,
   a step of forming a hang lead for coupling the chip support to a frame holding the lead, and
   a down-setting step for molding the hang lead and positioning the exposed surface of the chip support so as to project in a direction away from the lead on the same side of the mounting surface of the lead.

7. The method according to claim 6, wherein
the step of shaping a metal plate to form the chip support includes a punching step for punching a hole in the metal plate in a shape of the chip support from the exposed surface toward the sealed surface of the chip support.

8. The method according to claim 6, wherein
the down-setting step includes a step of molding the hang lead so as to have an up-set portion offset in a direction away from the lead on the opposite side of the mounting surface of the lead and a connecting portion for connecting the up-set portion and the chip support to each other.

9. A method of fabricating a lead frame for a semiconductor device having a semiconductor chip resin-sealed therein, the lead frame including a chip support to have the semiconductor chip carried thereon and having one surface serving as an exposed surface exposed from the sealing resin and the other surface serving as a sealed surface sealed into the sealing resin, and a lead to be electrically connected to the semiconductor chip within the sealing resin and to be sealed into the sealing resin such that at least a part of a mounting surface thereof which is a surface on the same side of the exposed surface is exposed from the sealing resin, the method comprising:
   a step of shaping a metal plate to form the lead;
   a step of shaping the metal plate to form the chip support;
   a step of forming a hang lead for coupling the chip support to a frame holding the lead; and
   a down-setting step for molding the hang lead and positioning the exposed surface of the chip support so as to project in a direction away from the lead on the same side of the mounting surface of the lead, wherein
the down-setting step includes a step of molding the hang lead so as to have an up-set portion offset in a direction away from the lead on the opposite side of the mounting surface of the lead and a connecting portion for connecting the up-set portion and the chip support to each other.

10. A method of fabricating a semiconductor device, comprising;
   a step of fabricating the lead frame by the method according to claim 6;
   a step of mounting the semiconductor chip on the sealed surface of the chip support; and
   a step of resin-sealing the lead frame, together with the semiconductor chip, such that the exposed surface of the chip support is exposed.

11. The method according to claim 10, wherein
the step of resin-sealing the lead frame includes a step of sealing the lead and the chip support with the sealing resin in a state where the mounting surface of the lead and the exposed surface of the chip support in the lead frame are pressed against a flat surface of a metal mold.

* * * * *